(12) United States Patent
Wu et al.

(10) Patent No.: US 9,391,151 B2
(45) Date of Patent: Jul. 12, 2016

(54) SPLIT GATE MEMORY DEVICE FOR IMPROVED ERASE SPEED

(71) Applicant: Taiwan Semiconductor Manufacturing Co., Ltd., Hsin-Chu (TW)

(72) Inventors: Chang-Ming Wu, New Taipei (TW); Tsung-Hsueh Yang, Taichung (TW); Sheng-Chieh Chen, Taichung (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/493,538

(22) Filed: Sep. 23, 2014

(65) Prior Publication Data
US 2016/0087056 A1   Mar. 24, 2016

(51) Int. Cl.
   *H01L 29/788* (2006.01)
   *H01L 29/423* (2006.01)
   *H01L 27/115* (2006.01)
   *H01L 21/28* (2006.01)

(52) U.S. Cl.
   CPC .... *H01L 29/42328* (2013.01); *H01L 21/28273* (2013.01); *H01L 27/11521* (2013.01); *H01L 29/788* (2013.01)

(58) Field of Classification Search
   CPC ................... H01L 27/11521; H01L 29/42328; H01L 21/28273; H01L 29/66825; H01L 29/7883; H01L 27/105
   See application file for complete search history.

(56) References Cited

U.S. PATENT DOCUMENTS

| | | | |
|---|---|---|---|
| 6,339,015 B1 * | 1/2002 | Bracchitta | H01L 21/28273 257/E21.209 |
| 6,426,257 B1 * | 7/2002 | Kanamori | H01L 21/28273 257/E21.209 |
| 6,723,604 B2 * | 4/2004 | Yuan | H01L 27/115 257/E21.682 |
| 2008/0217675 A1 * | 9/2008 | Liu | H01L 21/28273 257/321 |
| 2008/0268592 A1 * | 10/2008 | Park | H01L 21/28273 438/253 |
| 2008/0308858 A1 * | 12/2008 | Sandhu | H01L 21/28273 257/316 |
| 2011/0248328 A1 * | 10/2011 | Shen | H01L 21/28273 257/316 |

OTHER PUBLICATIONS

Alison Wood, et al.; "Etching Silicon Nitride and Silicon Oxide Using Ethylene Glycol/Hydrofluoric Acid Mixtures"; http://www.electrochem.org/dl/ma/196/pdfs/1065.PDF; Sep. 22, 2014, p. 1.
U.S. Appl. No. 14/713,462, filed May 15, 2015.

* cited by examiner

*Primary Examiner* — Jaehwan Oh
(74) *Attorney, Agent, or Firm* — Eschweiler & Associates, LLC

(57) ABSTRACT

Some embodiments relate to a memory device with an asymmetric floating gate geometry. A control gate is arranged over a floating gate. An erase gate is arranged laterally adjacent the floating gate, and is separated from the floating gate by a tunneling dielectric layer. A sidewall spacer is arranged along a vertical sidewall of the control gate, and over an upper surface of the floating gate. A portion of the floating gate upper surface forms a "ledge," or a sharp corner, which extends horizontally past the sidewall spacer. A sidewall of the floating gate forms a concave surface, which tapers down from the ledge towards a neck region within the floating gate. The ledge provides a faster path for tunneling of the electrons through the tunneling dielectric layer compared to a floating gate with a planar sidewall surface. The ledge consequently improves the erase speed of the memory device.

19 Claims, 19 Drawing Sheets

US 9,391,151 B2

SPLIT GATE MEMORY DEVICE FOR IMPROVED ERASE SPEED

BACKGROUND

FLASH memory is used in a wide variety of electronic applications. Some FLASH memory devices utilize a floating gate transistor, which stores one or more bits of data in the form of an electric charge trapped within a floating gate. The floating gate resides below a control gate, and above a channel region, of the floating gate transistor, but is electrically-isolated from both by dielectric layers. Therefore, electrons that tunnel into floating gate will remain there indefinitely. The electric charge trapped within the floating gate screens an electric field from the control gate within the channel region, which selectively changes the threshold voltage ($V_t$) of the floating gate transistor. For FLASH memory devices that use an array of such memory cells, the stored data can be read out of the array by measuring which cells have a higher $V_t$ (e.g., store a "1") and which cells have a lower Vt (e.g., store a "0"). Multi-bit cells are also possible, where a single memory cell has more than two discrete $V_t$ states corresponding to more than two data states.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
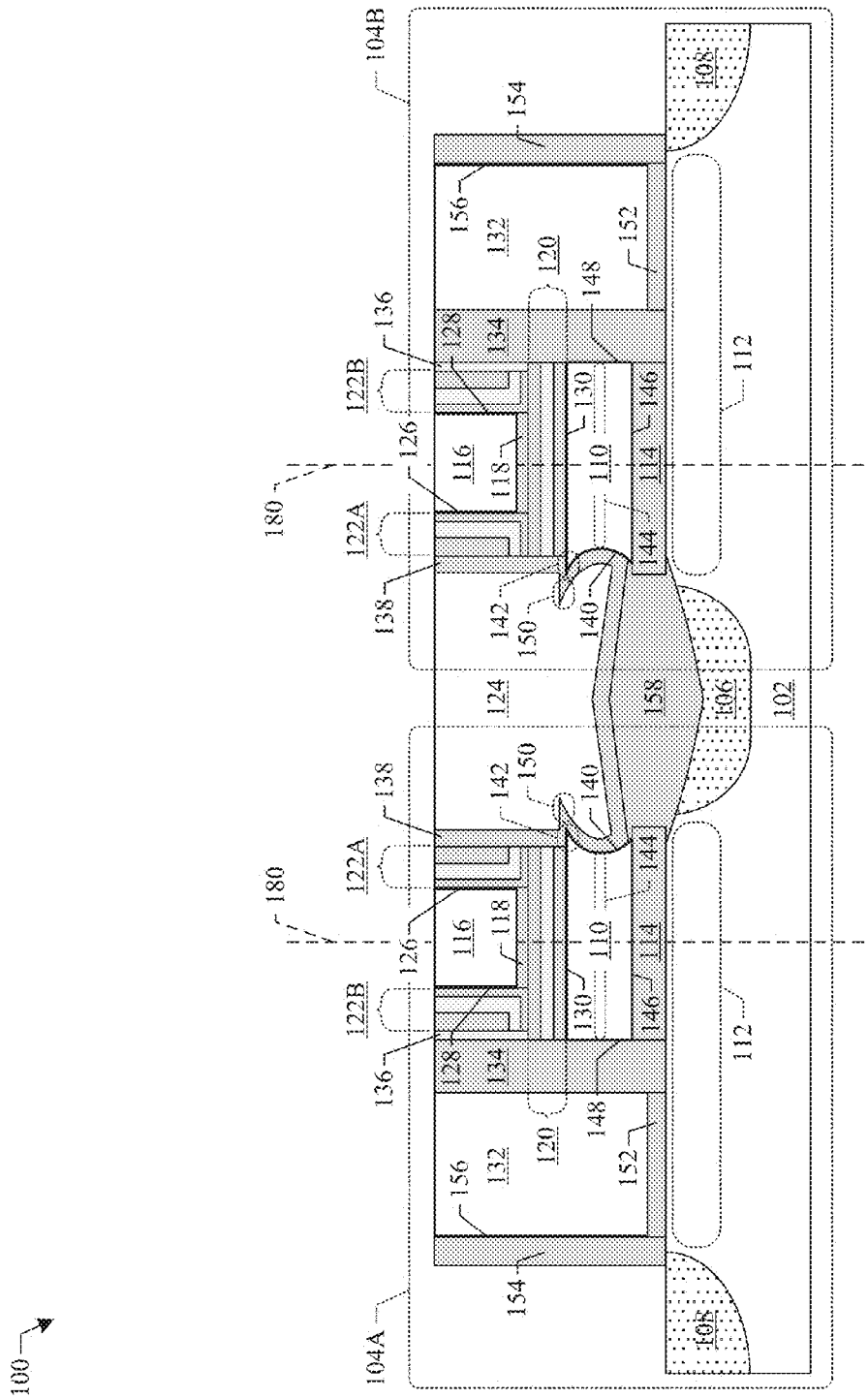
FIGS. 1A-1C illustrates a memory device in accordance with some embodiments.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some FLASH memory devices utilize a floating gate arranged over channel region of a semiconductor substrate, and separated from the channel region by a first dielectric. The channel region laterally separates source and drain regions of the semiconductor substrate from one another. A control gate is arranged over the floating gate, and is separated from the floating gate by a second dielectric. The control gate is narrower than the floating gate, such that a source-side and drain-side portions of the floating gate upper surface extend horizontally past opposite vertical sidewalls of the control gate. Source-side and drain-side spacers are arranged along the opposite vertical sidewalls of the control gate, and over the source-side and drain-side portions of the floating gate upper surface. A tunneling dielectric layer is arranged over vertical sidewalls of the floating gate, and over vertical sidewalls of the spacers. An erase gate is arranged laterally adjacent the floating gate over the source region.

The erase gate is separated from the control gate by both the source-side spacer and the tunneling dielectric layer, which in combination electrically isolate the control gate from the erase gate, even when the erase gate is biased. The erase gate is separated from the floating gate by only the tunneling dielectric layer. As a result, electrons from the floating gate may tunnel through the tunneling dielectric layer when the erase gate is biased, during an erase mode of operation of the FLASH memory device. An erase speed of FLASH memory device is determined, in part, by a rate at which the electrons to tunnel into the erase gate from the floating gate, through the tunneling dielectric layer. The tunneling rate of the electrons is determined, in part, by a thickness and uniformity of the tunneling dielectric layer, the bias applied to the erase gate, and a shape of the floating gate.

In view of the foregoing, some embodiments of the present disclosure are directed to a FLASH memory device. The FLASH memory device improves erase speed over some conventional memory devices through an asymmetric floating gate geometry. A control gate is arranged over a floating gate. An erase gate is arranged laterally adjacent the floating gate, and is separated from the floating gate by a tunneling dielectric layer. A sidewall spacer is arranged along a vertical sidewall of the control gate, and over an upper surface of the floating gate, between the control gate and the tunneling dielectric layer. A portion of the floating gate upper surface forms a "ledge," or a sharp corner, which extends horizontally past the sidewall spacer, pointing into the tunneling dielectric layer. A sidewall of the floating gate forms a concave surface, which tapers down from the ledge towards a neck region within the floating gate. The ledge provides a faster path for tunneling of the electrons through the tunneling dielectric layer compared to a floating gate with a planar sidewall surface. The ledge consequently improves the erase speed of the FLASH memory device over some conventional memory devices with planar floating gate sidewalls.

FIG. 1A illustrates a cross-sectional view of some embodiments of a memory device 100 formed on a semiconductor substrate 102, and including a pair of the memory cells 104A, 104B, which are mirror images of one another. The pair of the memory cells 104A, 104B have a shared common source region 106 and individual drain regions 108. Each memory cell 104A, 104B includes a floating gate 110 arranged over a channel region 112. A first gate dielectric 114 separates the floating gate 110 from the channel region 112. A control gate 116 is arranged over the floating gate 110. The control gate 116 is separated from the floating gate 110 by a second gate dielectric 118. An oxide-nitride-oxide (ONO) layer 120 is also arranged between the floating gate 110 and the control gate 116. An erase gate 124 is arranged adjacent the control and floating gates 116, 110, and over the shared common source region 106 of the memory device 100.

A source-facing sidewall spacer 122A is arranged between the control and erase gates 116, 124, and along a source-facing vertical sidewall 126 of the control gate 116, and over a floating gate upper surface 130. Similarly, a drain-facing sidewall spacer 122B is arranged along a drain-facing vertical sidewall 128 of the control gate 116, and over a floating gate upper surface 130. A memory gate 132 is arranged over the channel region 112. A gap oxide 134 isolates the drain-facing sidewall spacer 122B from the memory gate 132. A vertical nitride layer 136 isolates the drain-facing sidewall spacer 122B from the gap oxide 134. A third dielectric 152 separates the memory gate 132 from the channel region 112. A memory gate spacer 154 is formed along a drain-facing memory gate sidewall 156.

A portion of the floating gate upper surface 130 extends horizontally past the source-facing sidewall spacer 122A to form a floating gate ledge 142, near an interface between the control gate 116 and the floating gate 110, adjacent the erase gate 124. The source-facing floating gate sidewall 140 forms a concave surface, which tapers down from the floating gate ledge 142 towards a neck region 144 within the floating gate 110. The neck region 144 is narrower than the floating gate upper surface 130. In some embodiments, the neck region 144 is narrower than a floating gate lower surface 146, which resides directly over the first gate dielectric 114. A drain-facing floating gate sidewall 148 forms a substantially planar vertical surface. As a result of the different contours between the source-facing floating gate sidewall 140 and the drain-facing floating gate sidewall 148, the floating gate 110 has an asymmetric shape about a vertical axis 180 that bisects the floating gate upper surface 130.

A tunneling dielectric 138 provides a tunneling path between the floating and erase gates 110, 124. The tunneling dielectric 138 is disposed conformally along the source-facing sidewall spacer 122A, over the floating gate upper surface 130, and along a source-facing floating gate sidewall 140. As a result, a horizontal surface of the tunneling dielectric 138 arranged over the floating gate upper surface 130 forms a tunneling dielectric ledge 150, which is arranged over the floating gate ledge 142. The tunneling dielectric 138 is also disposed over a field dielectric 158, which electrically isolates the erase gate 124 from the shared common source region 106.

The floating gate ledge 142 and underlying concave surface of the source-facing floating gate sidewall 140 forms a ledge shape that "points" into the tunneling dielectric 138 and towards the erase gate 124. The floating gate ledge 142 provides a faster path for tunneling of the electrons through the tunneling dielectric 138 between the floating gate 110 and the erase gate 124 compared to a planar source-facing floating gate sidewall 140 without a floating gate ledge 142. The floating gate ledge 142 therefore improves the erase speed of the memory device 100 over some conventional memory devices that do not include a floating gate ledge 142.

Figure 1B:
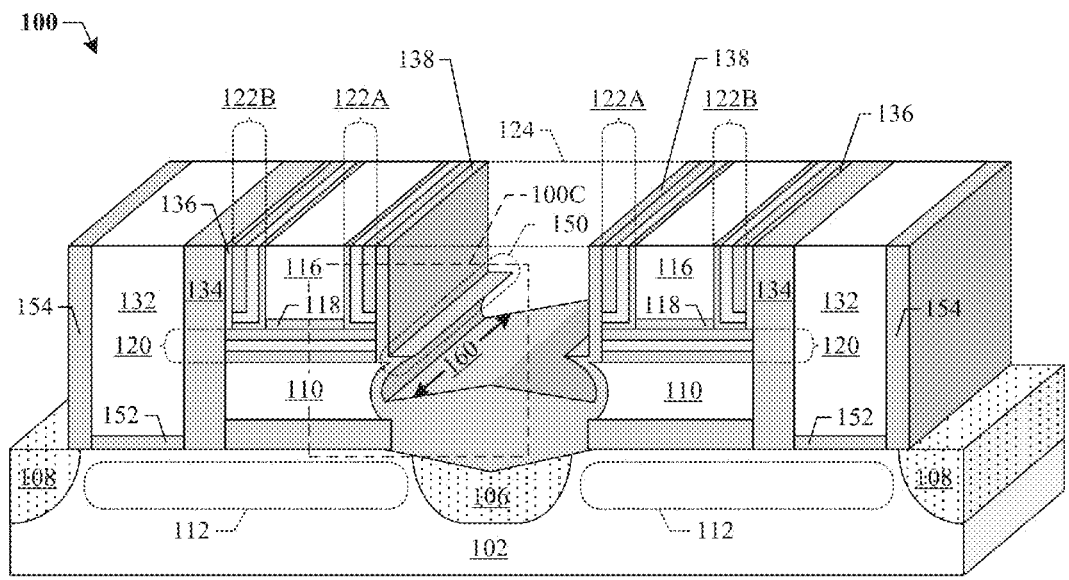

FIG. 1B illustrates a perspective view of the memory device 100, with the erase gate 124 removed to provide a full view of the tunneling dielectric ledge 150, which extends along a length 160 of the source-facing sidewall spacer 122A of the control gate 116.

Figure 1C:
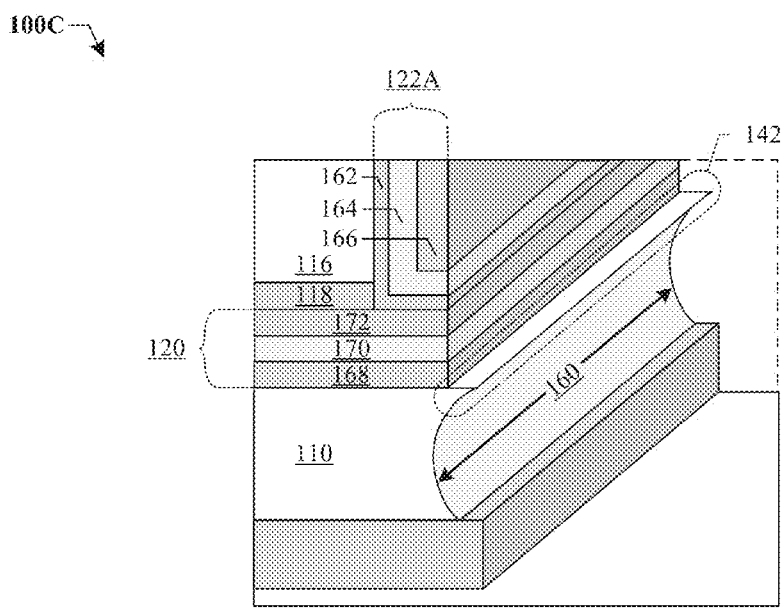

FIG. 1C illustrates a "cut out" 100C of the perspective view of the memory device 100 of FIG. 1B, with the tunneling dielectric 138 removed to provide a full view of the floating gate ledge 142. The floating gate ledge 142 also extends along the length 160 of the source-facing sidewall spacer 122A of the control gate 116. The cut out 100C also provides a close up view of the source-facing sidewall spacer 122A and the ONO layer 120. The source-facing sidewall spacer 122A comprises a first spacer dielectric layer 166, a spacer nitride layer 164, and a second spacer dielectric layer 162. The ONO layer 120 comprises a first dielectric layer 168 arranged over the floating gate 110, a first nitride layer 170 arranged over the first dielectric layer 168, and a second dielectric layer 172 arranged over the first nitride layer 170. The ONO layer 120 and the second gate dielectric 118 together electrically isolate the floating gate 110 from the control gate 116.

Although the shared common source region 106 and the individual drain regions 108 are labeled as such for clarity, it is appreciated that the shared common source region 106 can act as a drain region for either of the pair of the memory cells 104A, 104B, depending on the mode of operation of the memory device 100. Likewise, it is also appreciated that the individual drain regions 108 may also be used as individual source regions for either of the pair of the memory cells 104A, 104B, depending on the mode of operation of the memory device 100. In this sense, the shared common source region 106 and the individual drain regions 108 are interchangeable.

Figure 2:
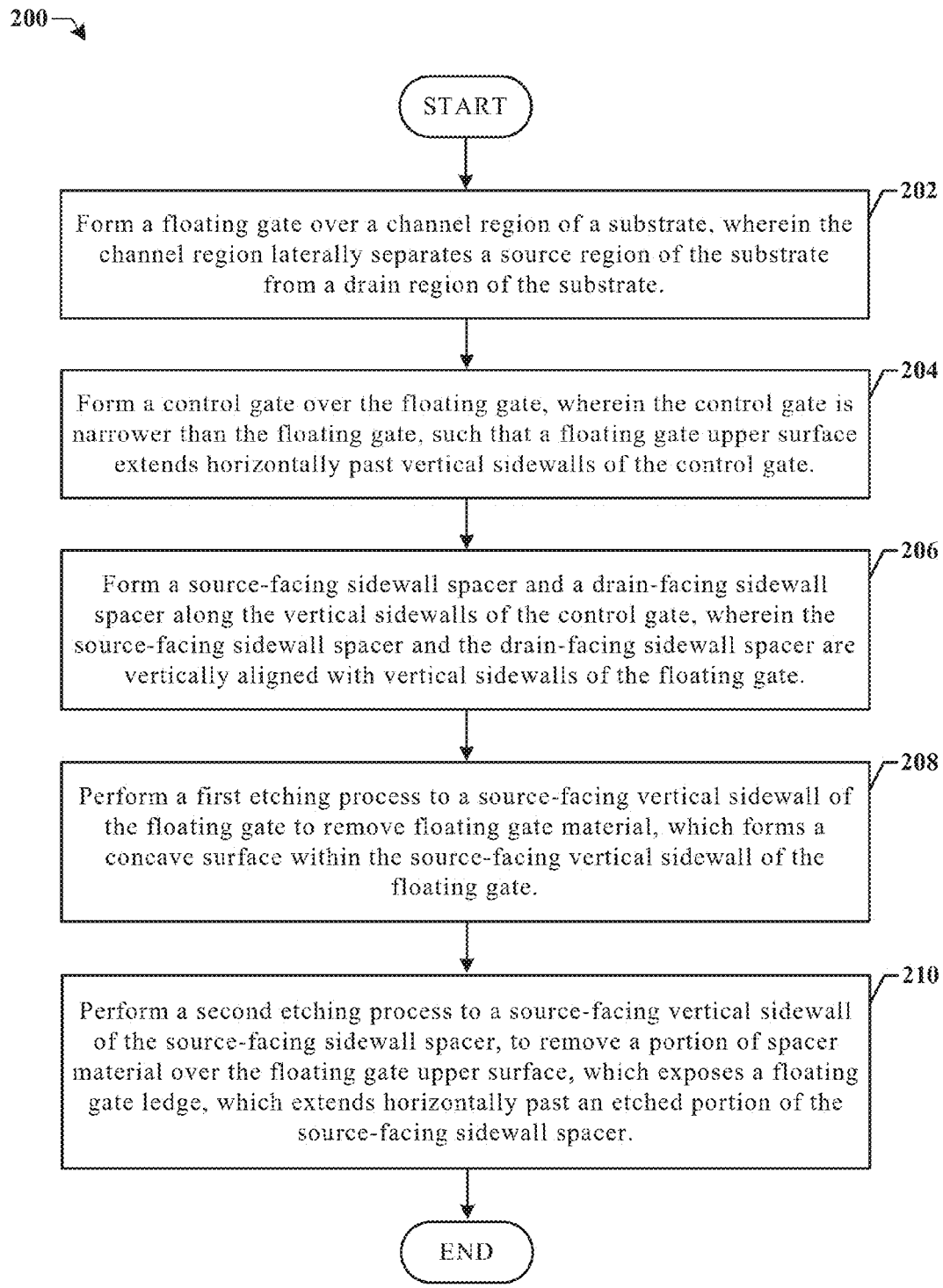
FIG. 2 illustrates a method to form a memory device in accordance with some embodiments.

FIG. 2 illustrates some embodiments of a method 200 to form a memory device. While method 200 is described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a floating gate is formed over a channel region of a substrate, and is separated from the channel region by a first dielectric, wherein the channel region separates source and drain regions of the substrate from one another. In some embodiments, the floating gate and first gate dielectric are formed by forming a first gate dielectric layer over the channel, then forming a first polysilicon layer over the first gate dielectric layer. The first polysilicon layer and first gate dielectric layer are then patterned, and etched away from areas of the substrate surface, other than the channel region, to form the first gate dielectric and the floating gate. In other embodiments, the floating gate can be a metal layer, such as a copper, aluminum, nickel, or tungsten layer, or alloys thereof, for example.

At 204, a control gate is formed over the floating gate, and is separated from the floating gate by a second dielectric. The control gate is narrower than the floating gate. In some embodiments, the control gate and second gate dielectric are formed by forming a second gate dielectric layer over the first polysilicon layer, then forming a second polysilicon layer over the second gate dielectric layer. The second polysilicon layer and second gate dielectric layer are then patterned and etched, along with the first polysilicon and dielectric layers, to form the second gate dielectric and the control gate. In other embodiments, the control gate can be a metal layer, such as a copper, aluminum, nickel, tungsten layer, or alloys thereof, for example.

At 206 a source-facing sidewall spacer and a drain-facing sidewall spacer are formed along vertical sidewalls of the control gate. Upon formation, the source-facing sidewall spacer and the drain-facing sidewall spacer are vertically aligned with vertical sidewalls of the floating gate. Formation of the source-facing sidewall spacer and the drain-facing sidewall spacer will be demonstrated in detail in the embodiments of FIGS. 3A-3P.

At 208, a first etching process is performed to a source-facing vertical sidewall of the floating gate to remove floating gate material, which forms a concave surface within the source-facing vertical sidewall of the floating gate.

At 210 a second etching process is performed to a source-facing vertical sidewall of the source-facing sidewall spacer, to remove a portion of spacer material over the floating gate upper surface. The second etching process exposes a floating gate ledge, which extends horizontally past an etched portion of the source-facing sidewall spacer. The concave surface of the source-facing vertical sidewall of the floating gate meets the floating gate upper surface at the floating gate ledge.

Figure 3A:
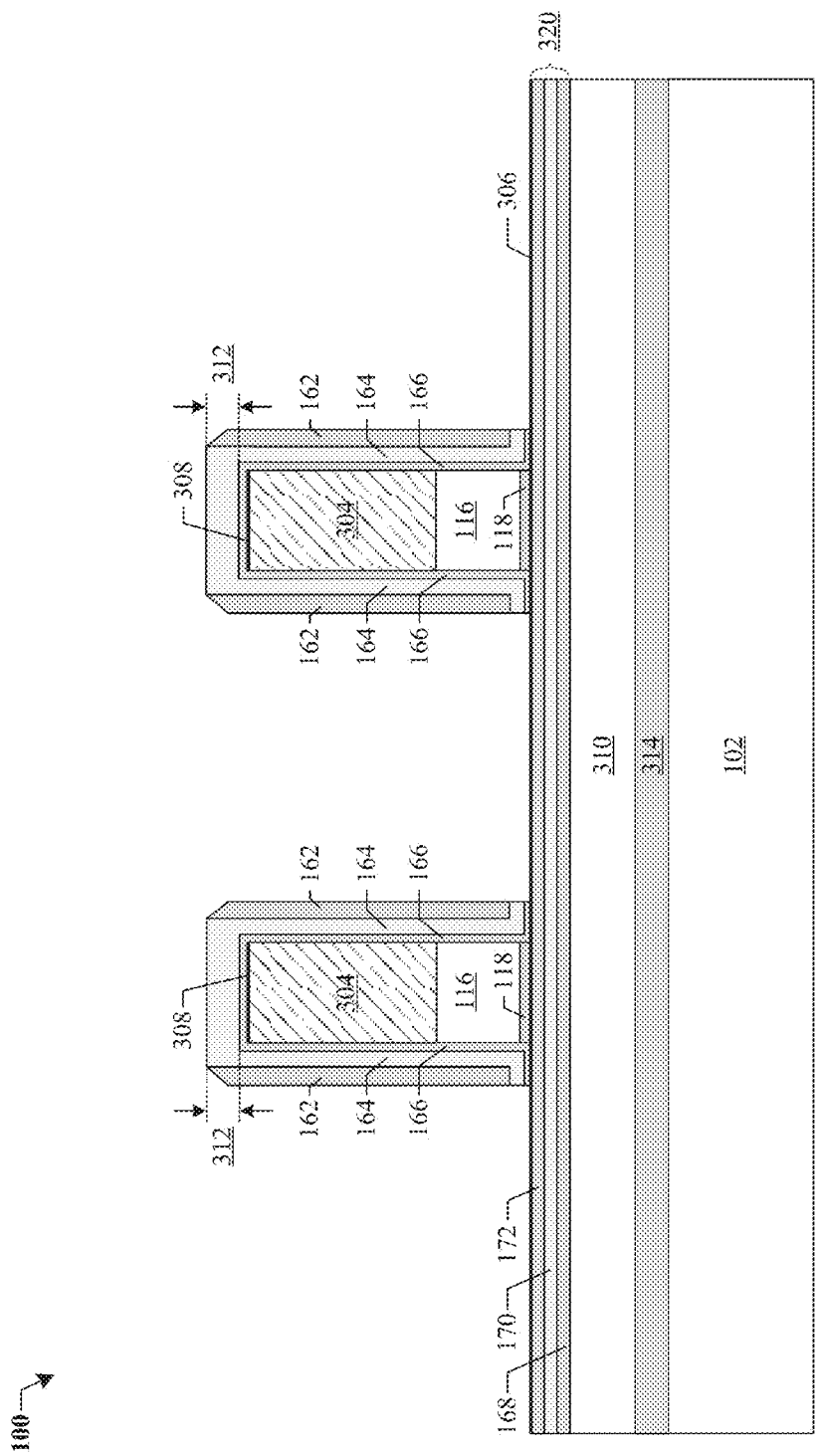
FIGS. 3A-3P illustrate a series of cross-sectional views that collectively depict formation of a memory device in accordance with some embodiments.
Figure 3B:
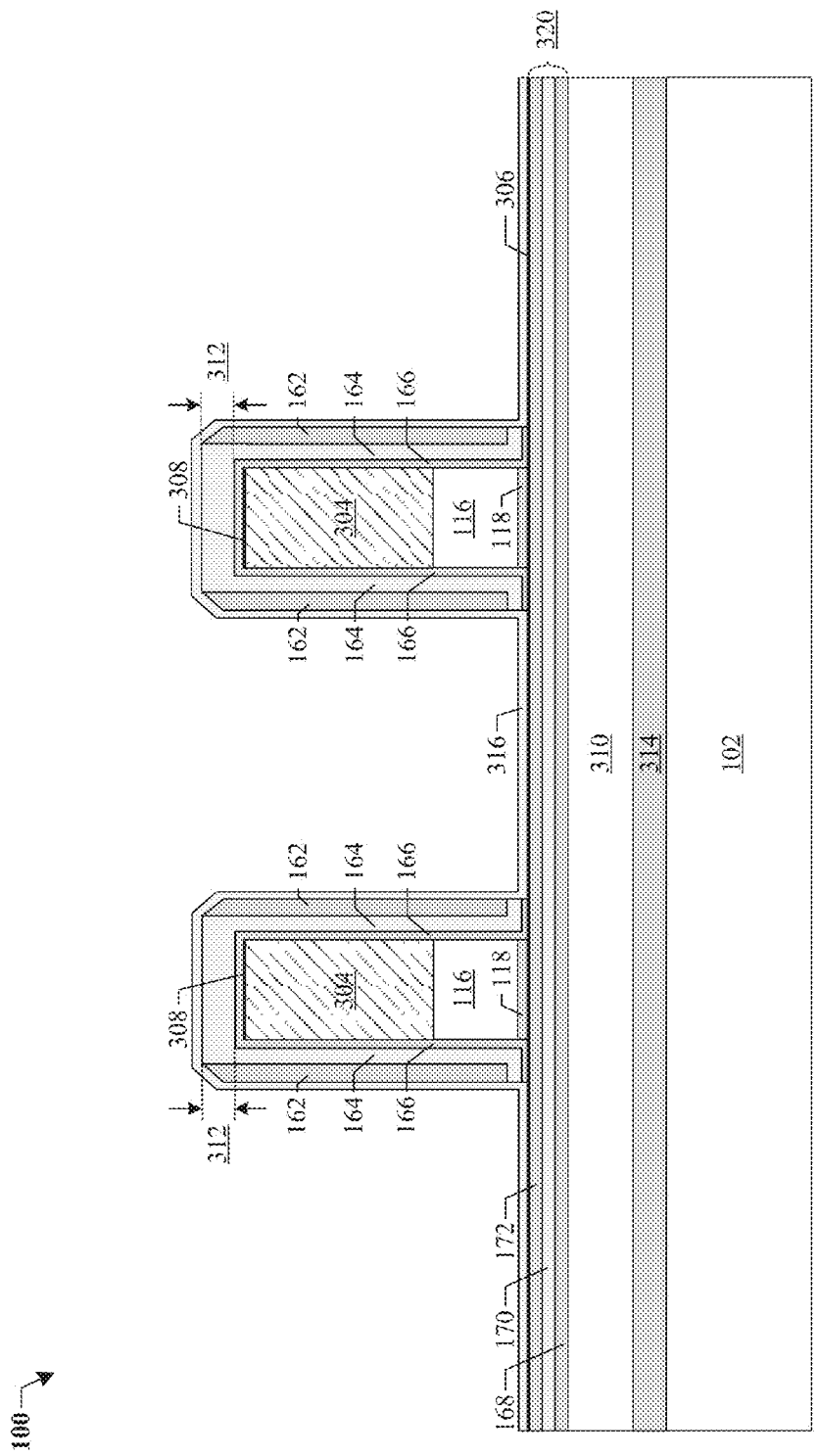
Figure 3C:
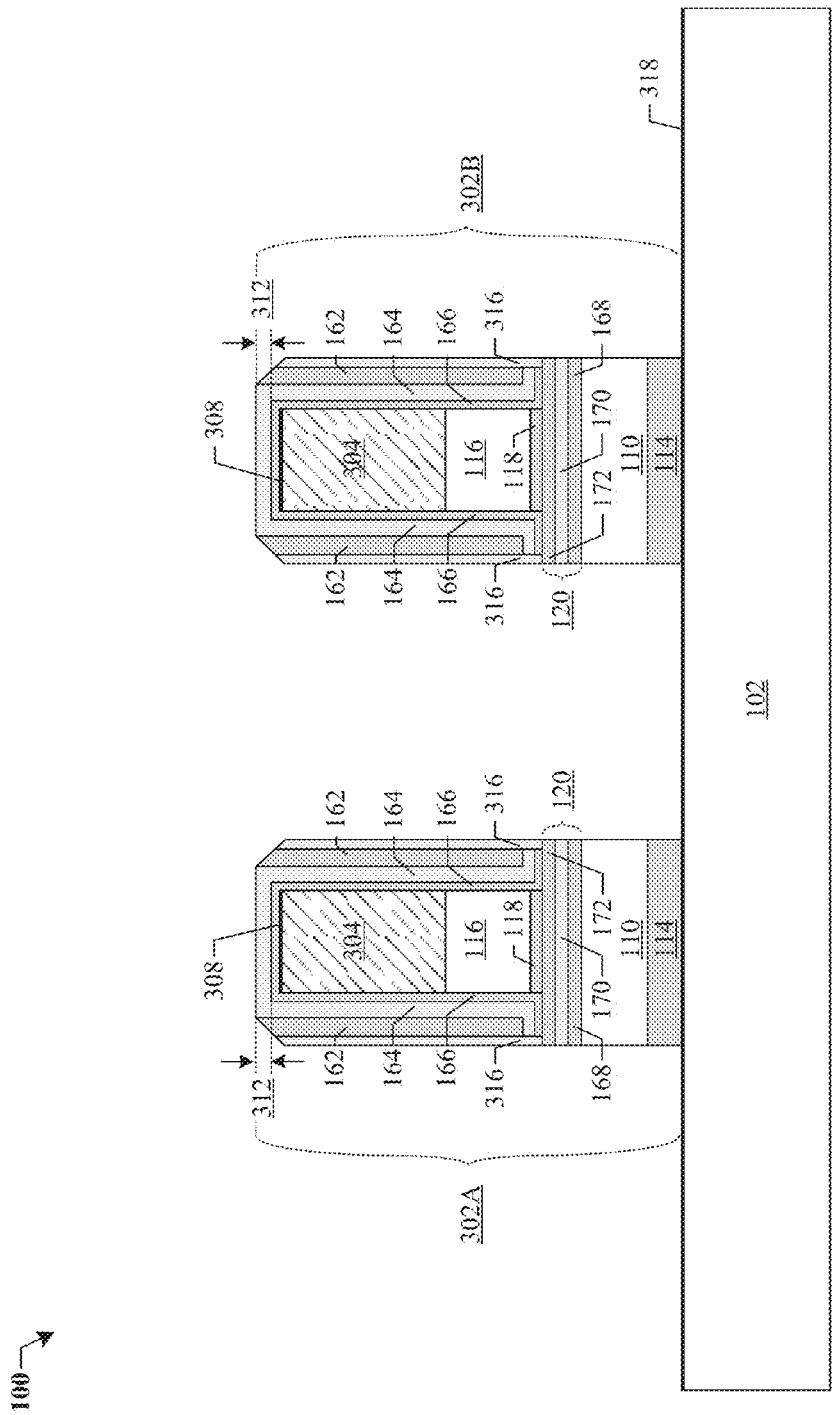
Figure 3D:
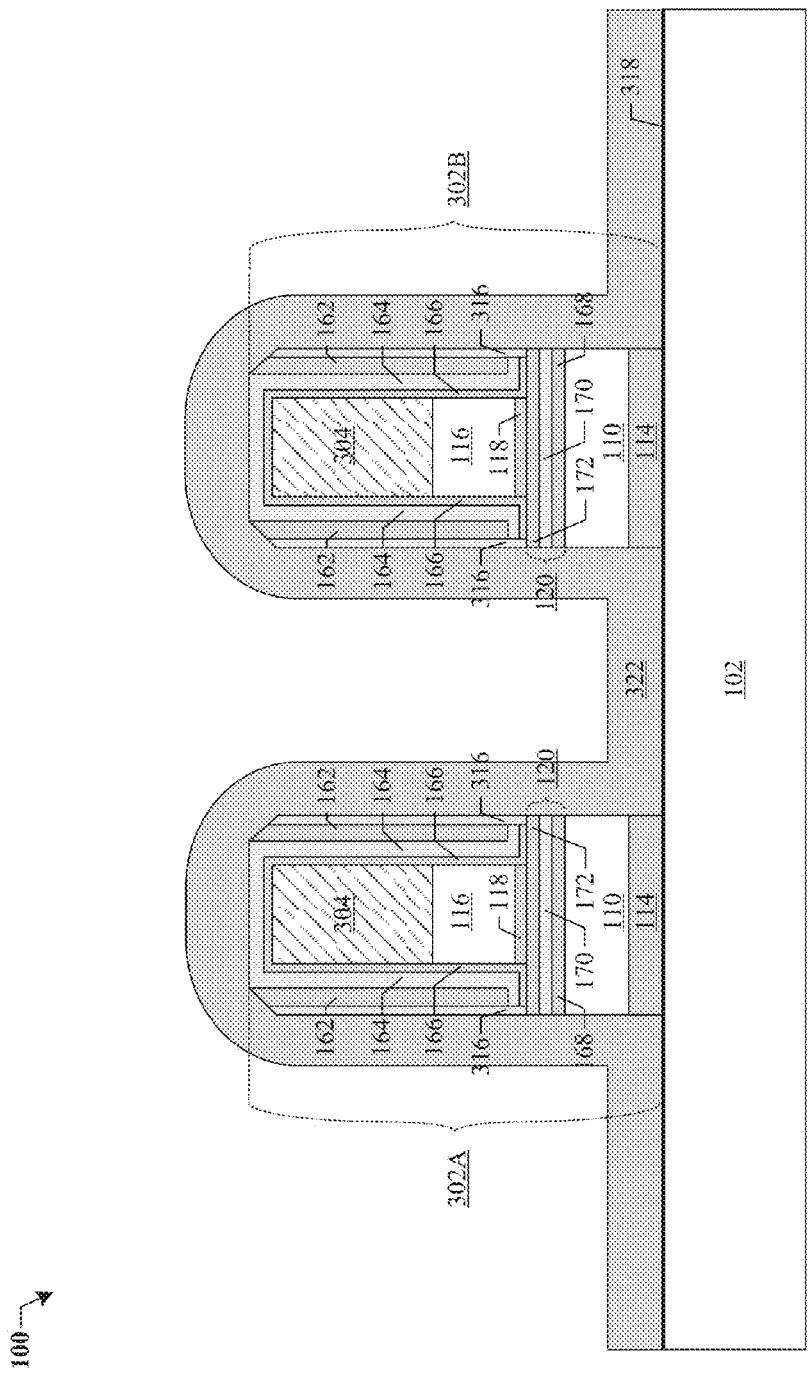
Figure 3E:
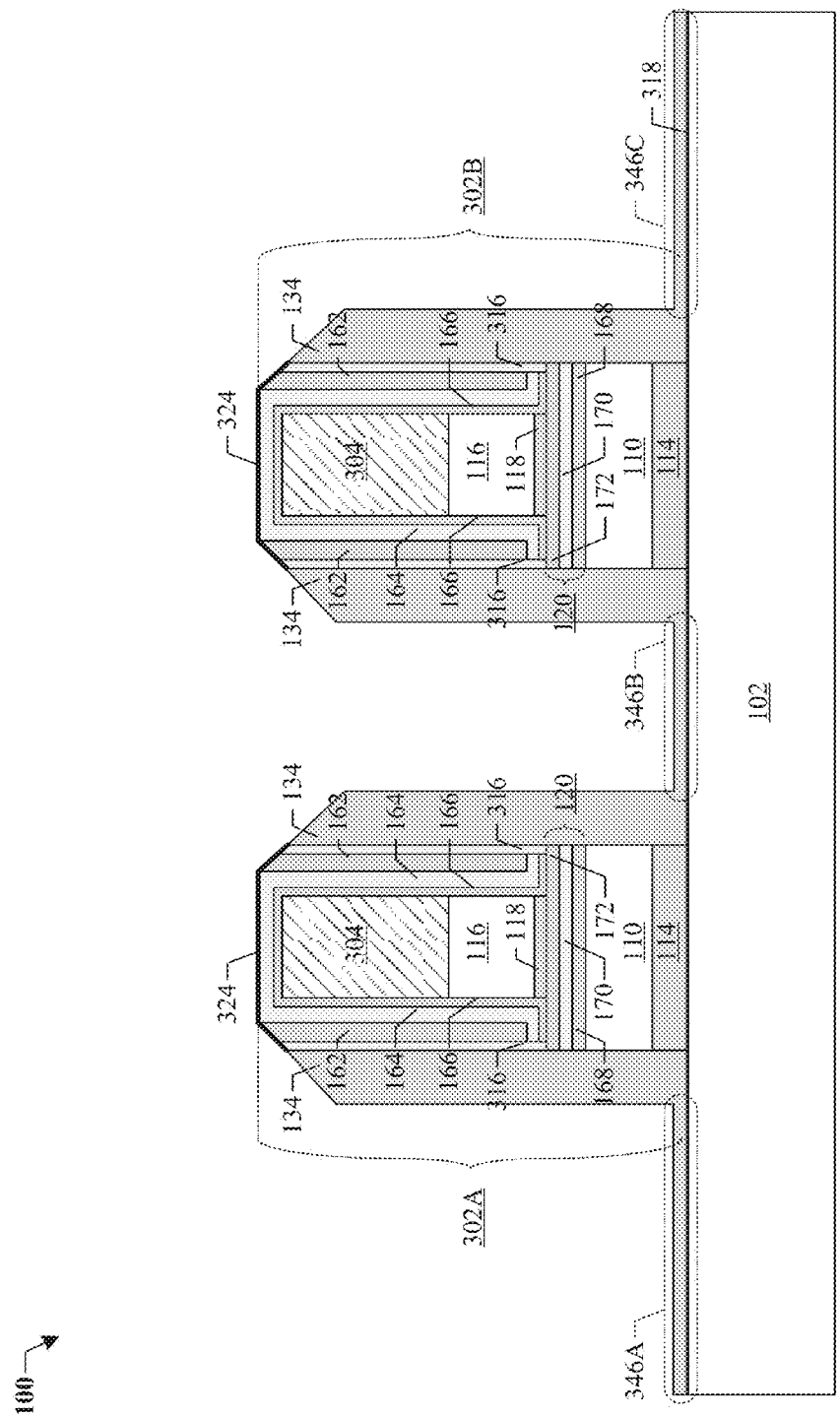
Figure 3F:
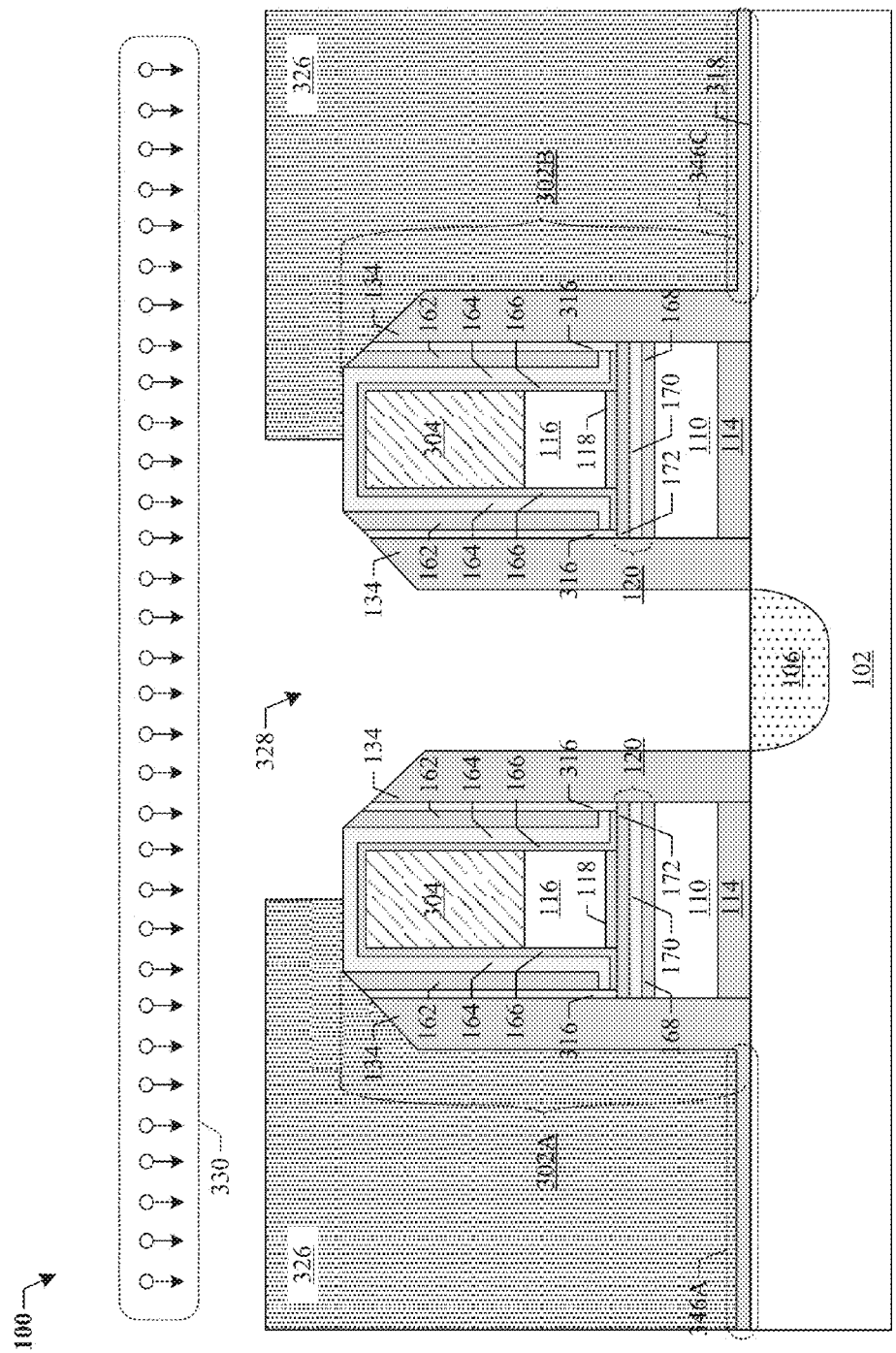
Figure 3G:
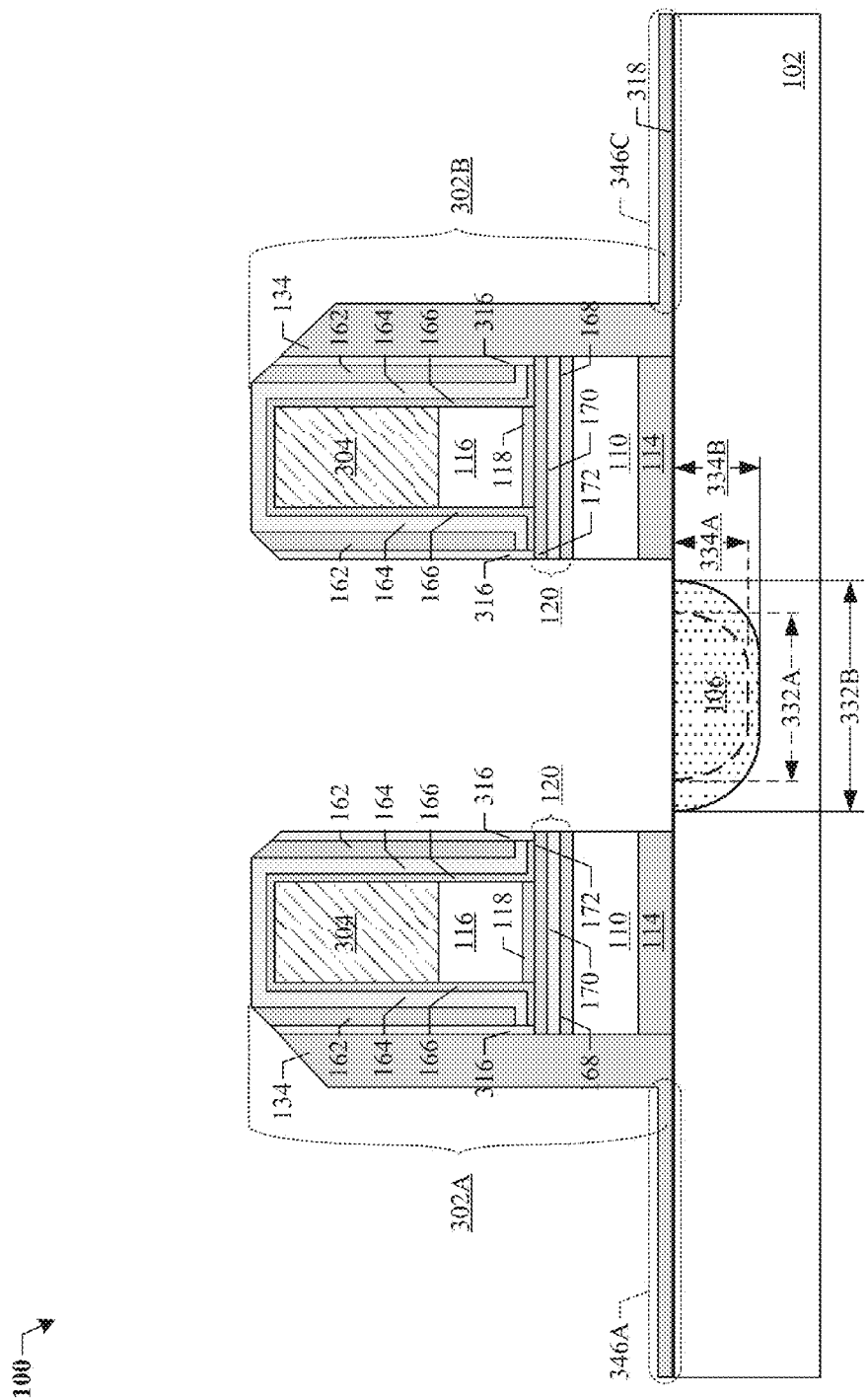
Figure 3H:
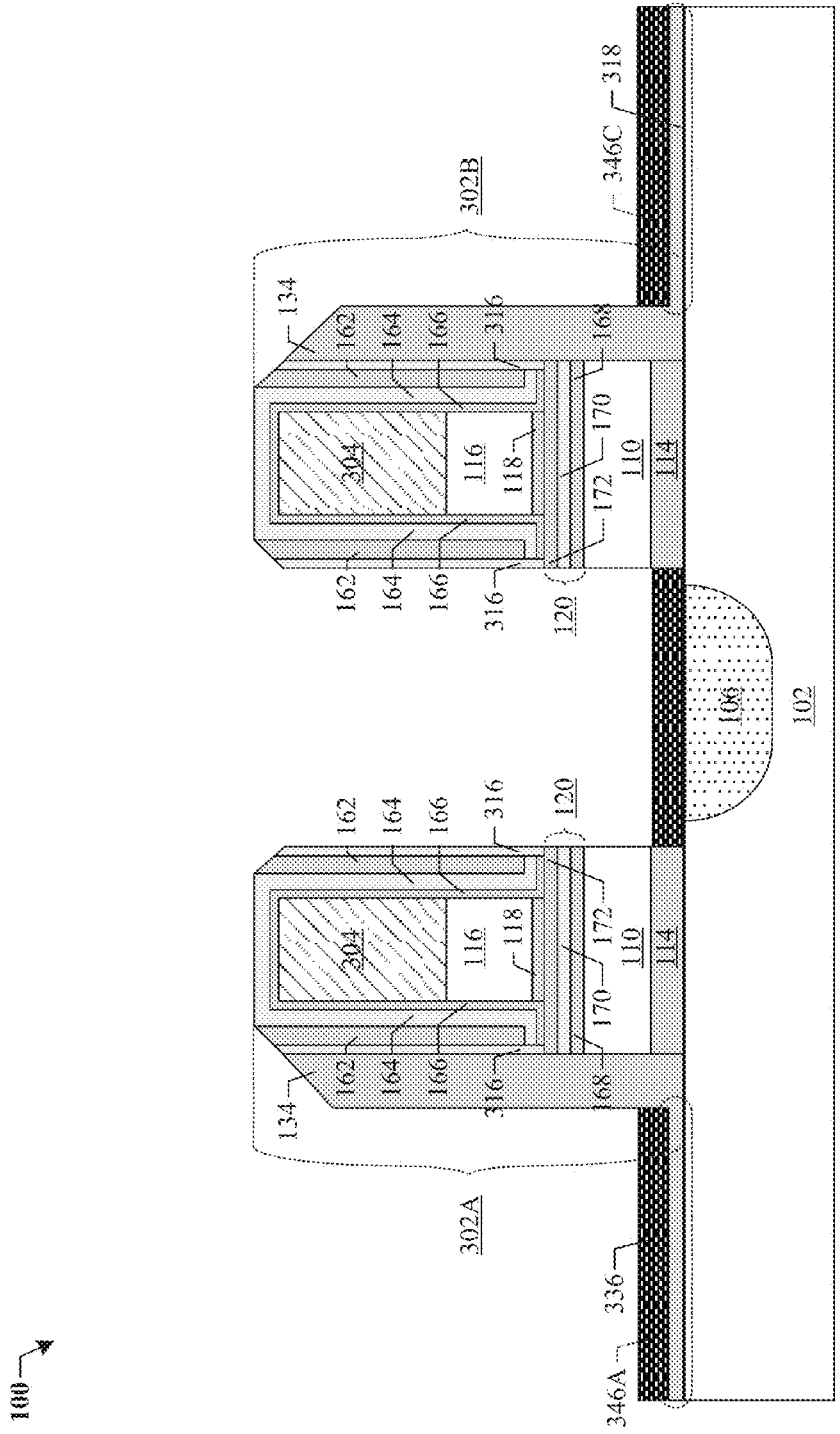
Figure 3I:
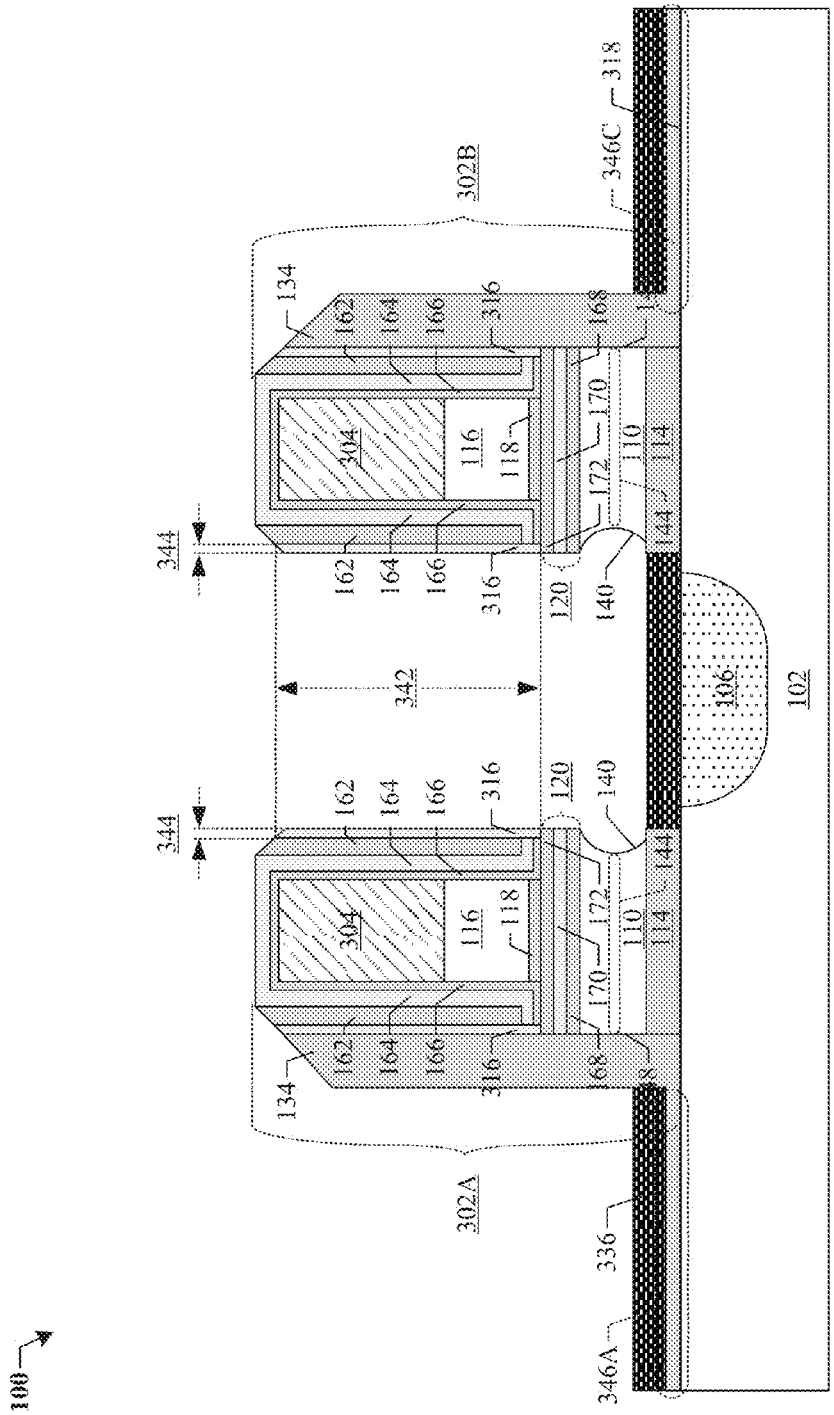
Figure 3J:
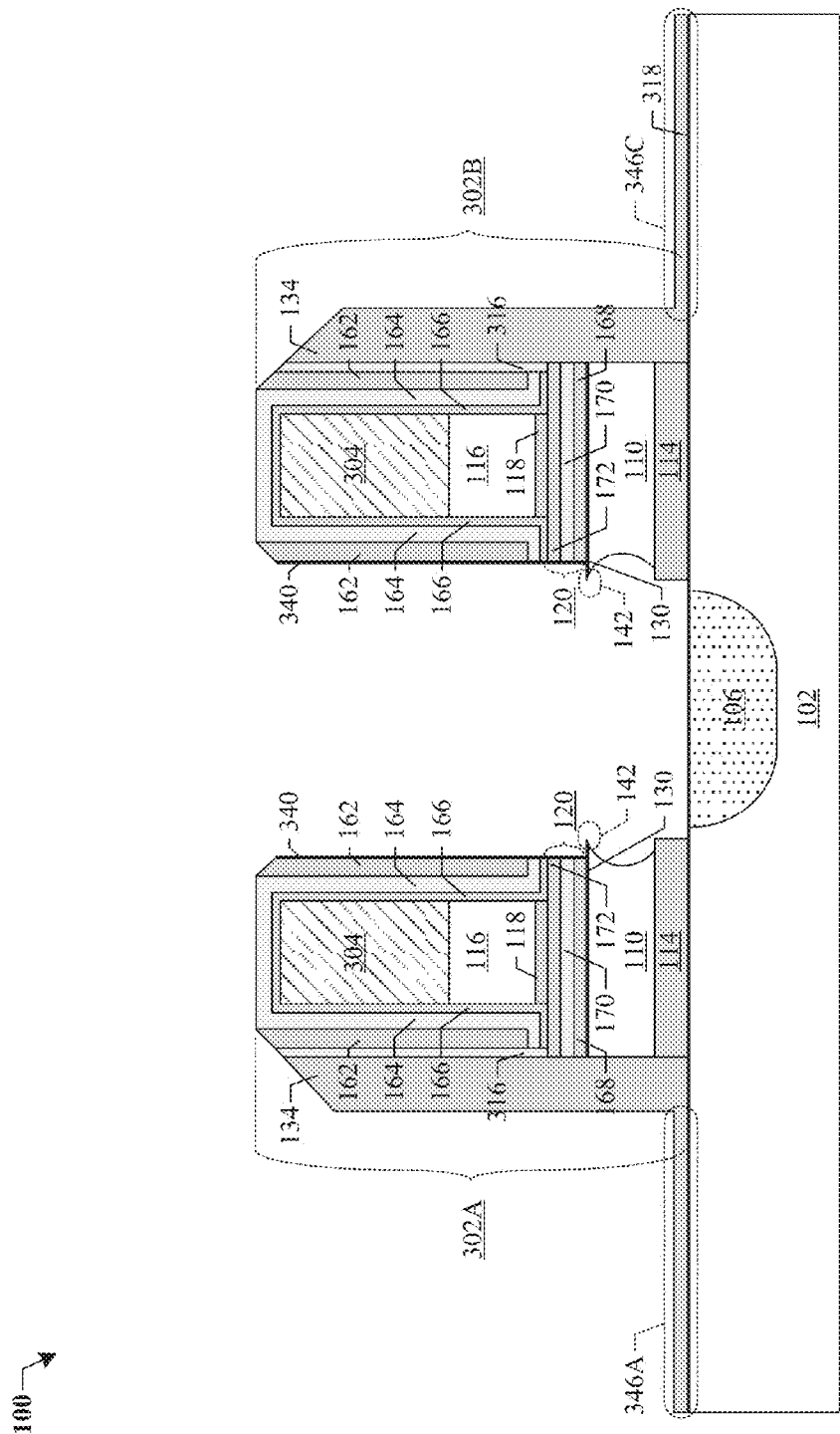
Figure 3K:
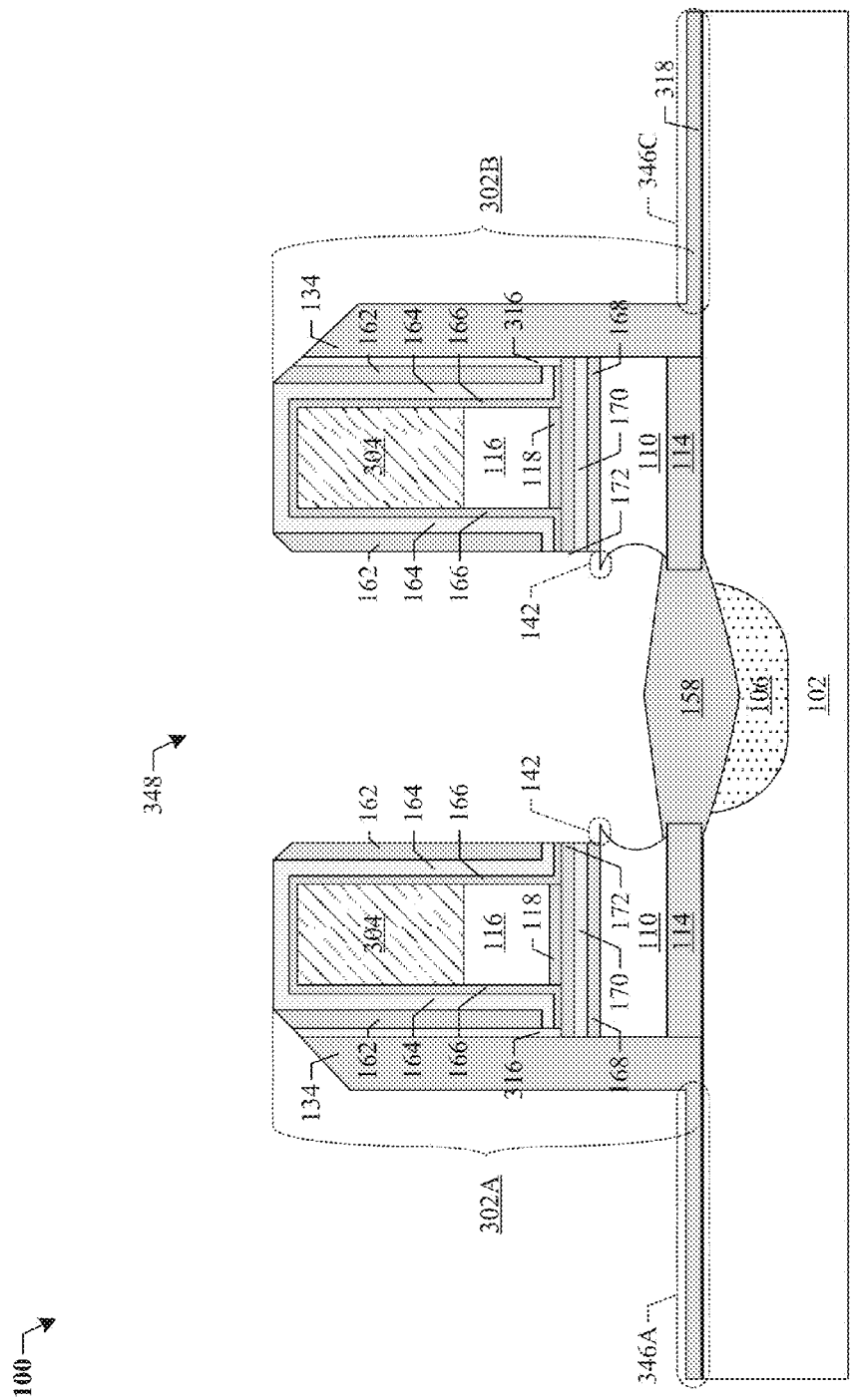
Figure 3L:
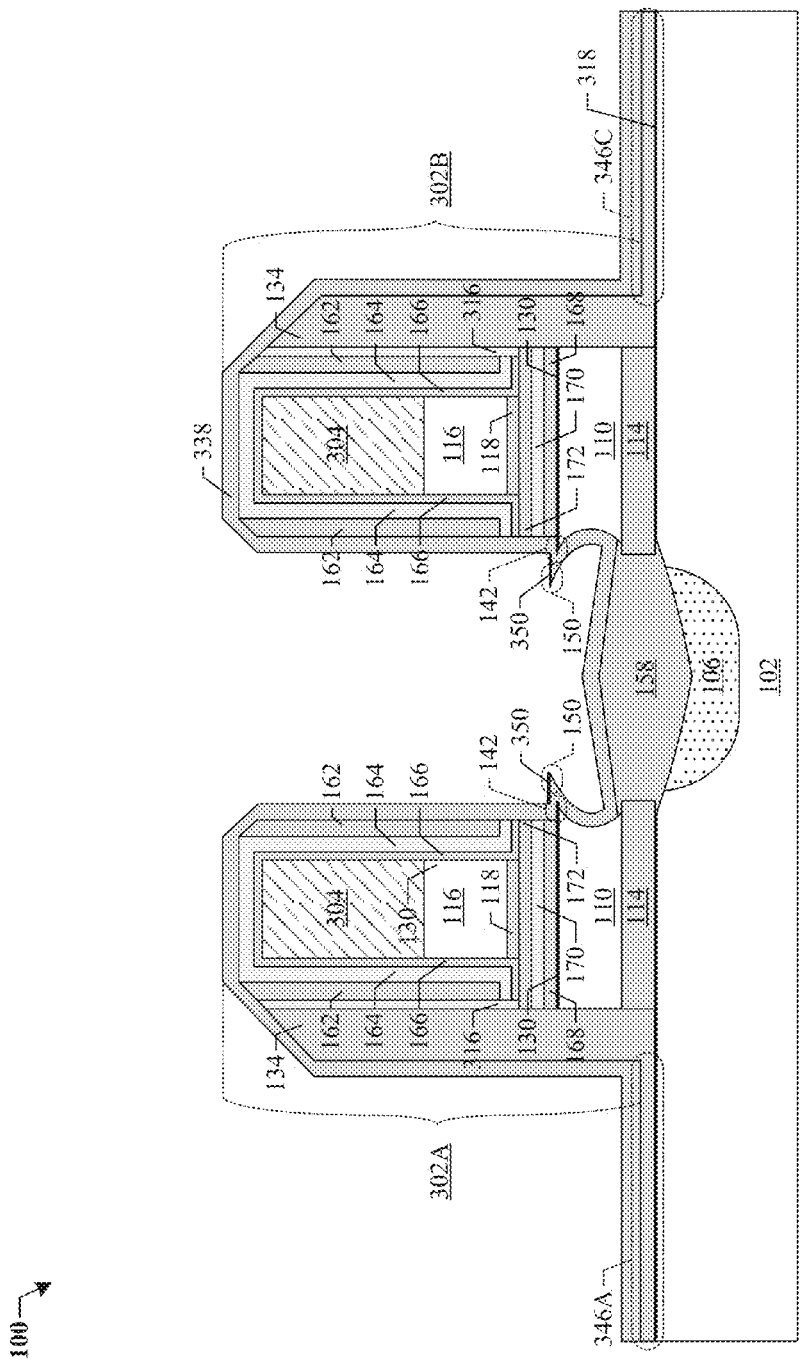
Figure 3M:
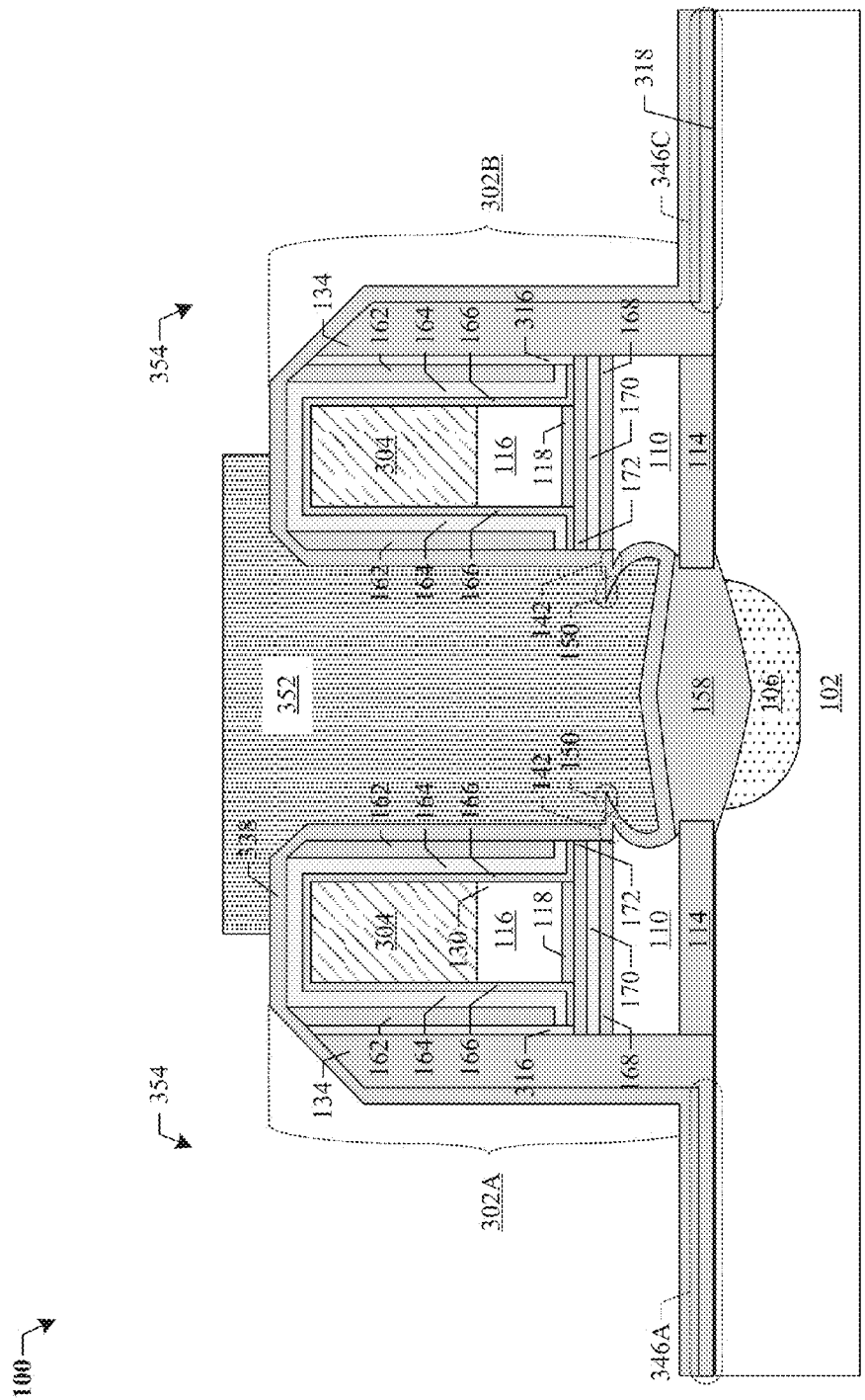
Figure 3N:
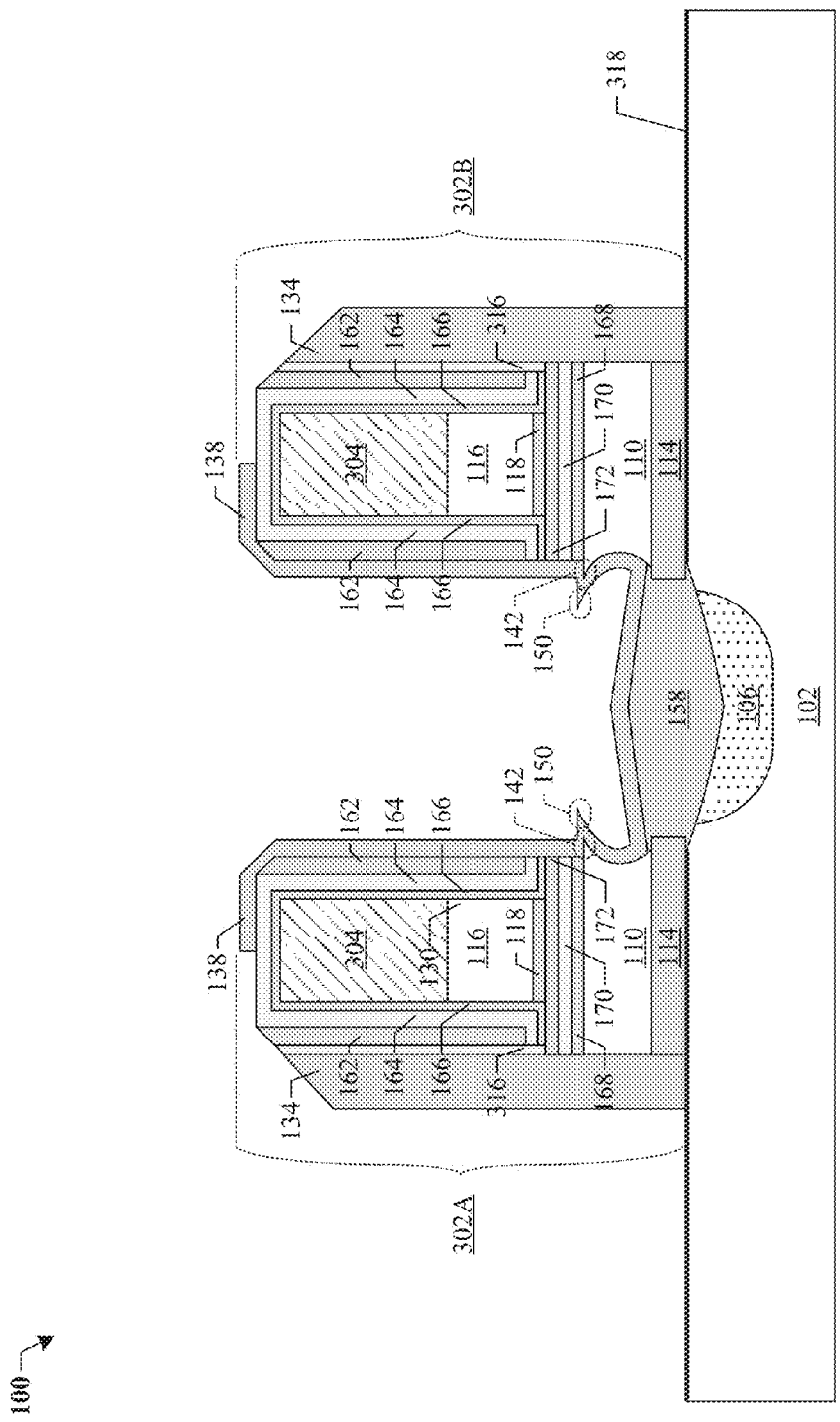
Figure 30:
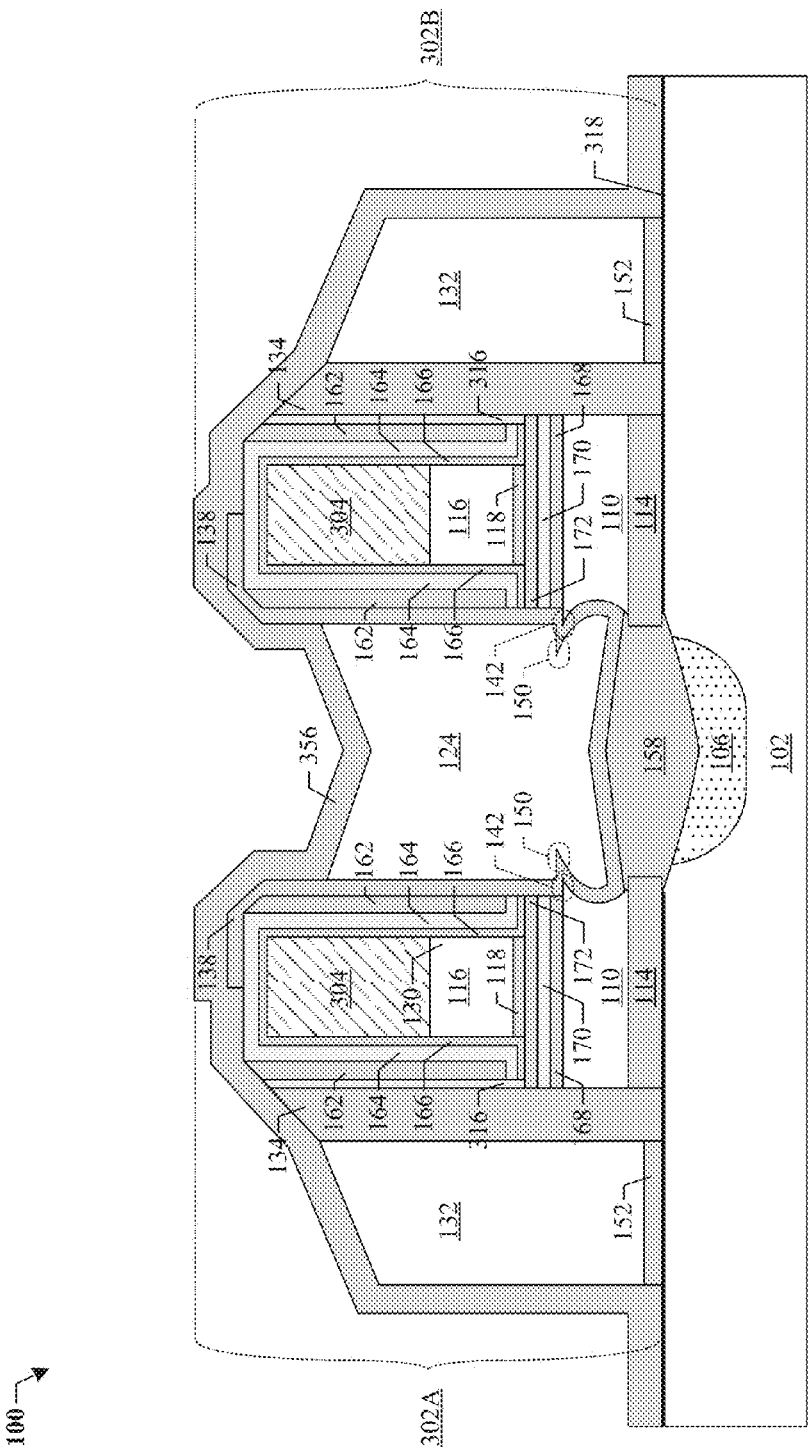
Figure 3P:
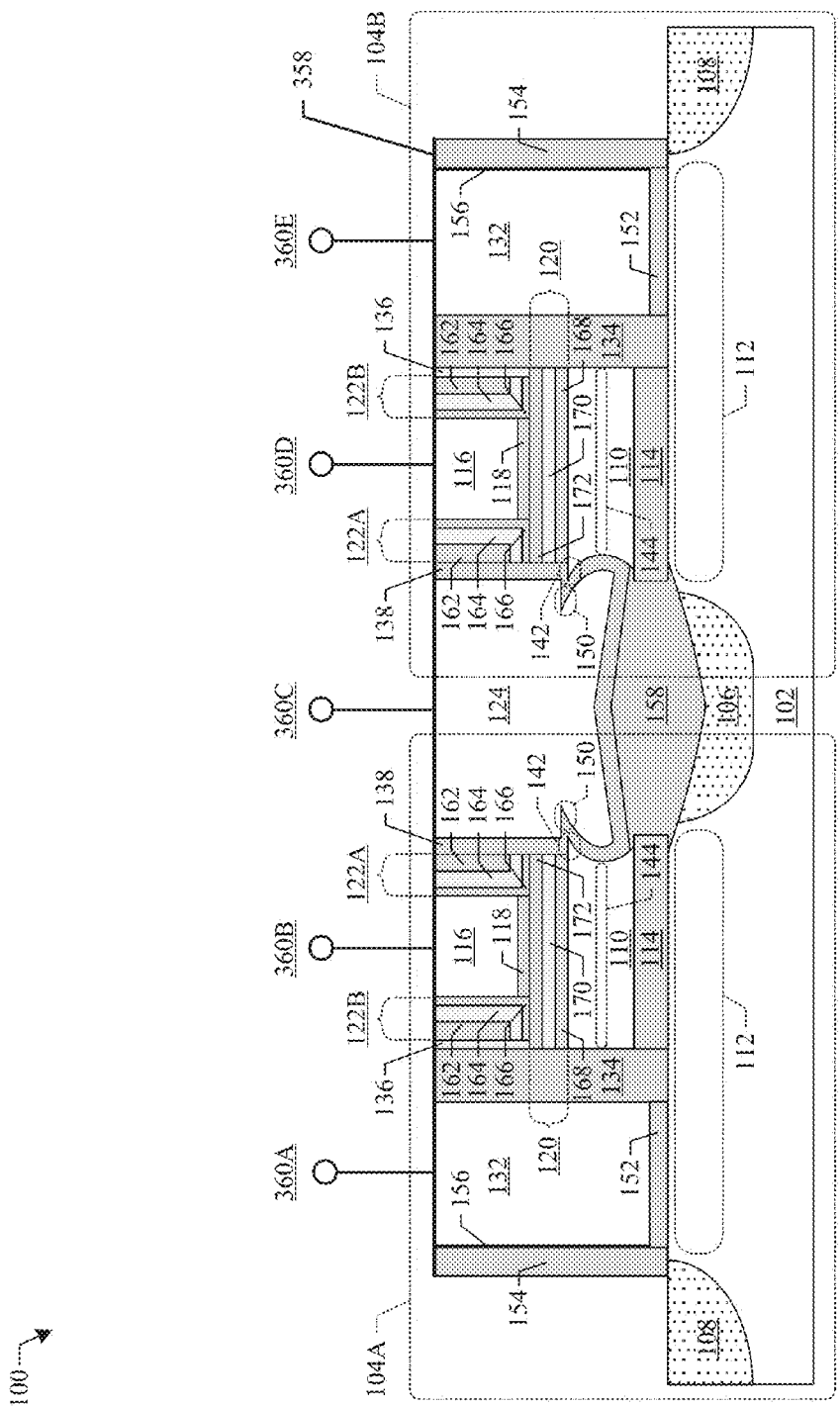

FIGS. 3A-3P illustrate a series of cross-sectional views that collectively depict formation of the memory device 100 in accordance with some embodiments. Although FIGS. 3A-3P are described in relation to the method 200, it will be appreciated that the structures disclosed in FIGS. 3A-3P are not limited to the method 200, but instead may stand alone as structures independent of the method 200. Similarly, although the method 200 is described in relation to FIGS. 3A-3P, it will be appreciated that the method 200 is not limited to the structures disclosed in FIGS. 3A-3P, but instead may stand alone independent of the structures disclosed in FIGS. 3A-3P.

In FIG. 3A, a first gate dielectric layer 314 (e.g., $SiO_2$) has been formed over a semiconductor substrate 102. A floating gate layer 310 (e.g., polysilicon) has then been formed over the first gate dielectric layer 314. An oxide-nitride-oxide (ONO) layer 320 has been formed over the floating gate layer 310. The ONO layer 320 comprises a first dielectric layer 168 (e.g., $SiO_2$), a first nitride layer 170 (e.g., SiN), and a second dielectric layer 172, which are sequentially-formed atop one another. Second gate dielectrics 118 (e.g., $SiO_2$) have been formed over the ONO layer 320. Control gates 116 (e.g., polysilicon) have been formed over the second gate dielectrics 118. Hard masks 304 (e.g., SiN) have been formed over the control gates 116. In some embodiments, formation of the second gate dielectrics 118, the control gates 116, and the hard masks 304 comprises sequentially-depositing a second gate dielectric layer, a control gate layer, and a hard mask layer, over the ONO layer 320. The sequentially-deposited layers have then been patterned and etched through photolithography to form the second gate dielectrics 118, the control gates 116, and the hard masks 304. In some embodiments, the first gate dielectric layer 314, the floating gate layer 310, the ONO layer 320, and the sequentially-deposited layers are formed by a chemical vapor deposition (CVD) (e.g., low-pressure CVD (LPCVD) or plasma-enhanced CVD (PECVD)), physical vapor deposition (PVD), atomic layer deposition (ALD), molecular beam epitaxy (MBE), electron beam (e-beam) epitaxy, or other appropriate process.

A first spacer dielectric layer 166 has then been formed along sidewalls of the second gate dielectrics 118, the control gates 116, and the hard masks 304, over an upper surface 306 of the ONO layer 320, and over a top surfaces 308 of the hard masks 304, by CVD or other appropriate method. A spacer nitride layer 364 has then been formed over the first spacer dielectric layer 166. A second spacer dielectric layer 362 has then been formed over the spacer nitride layer 164. The first spacer dielectric layer 166, the spacer nitride layer 164, and the second spacer dielectric layer 162 are formed conformally. These conformally-formed layers have been subsequently etched to remove portions of the conformally-formed layers from over the upper surface 306 of the ONO layer 320, and to remove portions of the first spacer dielectric layer 166 from over the top surfaces 308 of the hard masks 304.

In FIG. 3B, a second nitride layer 316 has been formed over the upper surface 306 of the ONO layer 320, along sidewalls of the second gate dielectrics 118, the control gates 116, and the hard masks 304, and over the top surfaces 308 of the hard masks 304 through CVD or other appropriate process.

In FIG. 3C, an etch has been performed to remove potions of the second nitride layer 316 and the ONO layer 320 from a substrate upper surface 318. The etch also removes portions of the floating gate layer 310 to form a floating gate 110. The etch also removes portions of the first gate dielectric layer 314 to form a first gate dielectric 114. The etch also removes the second nitride layer 316 from over the top surfaces 308 of the hard masks 304, and reduces a thickness 312 of the spacer nitride layer 164 over the top surfaces 308 of the hard masks 304. The etch consequently forms first and second gate stacks 302A, 302B. In some embodiments the etch comprises a dry etch (e.g., a plasma etch with tetrafluoromethane ($CF_4$), sulfur hexafluoride ($SF_6$), nitrogen trifluoride ($NF_3$), etc.).

In FIG. 3D, a gap oxide layer 322 has been formed over the first and second gate stacks 302A, 302B, and over the substrate upper surface 318. In various embodiments, the gap oxide layer 322 includes silicon dioxide ($SiO_2$) formed through PVD, CVD, ALD, MBE, e-beam epitaxy, or other appropriate process.

In FIG. 3E, the gap oxide layer 322 has been etched away from top surfaces 324 of the first and second gate stacks 302A, 302B, while portions of the gap oxide layer 322 have been left along sidewalls of the first and second gate stacks 302A, 302B to form gap oxides 134. In addition, a substantial amount of the gap oxide layer 322 has been etched away from the substrate upper surface 318. However, small horizontal portions 346A-346C, with a thickness between 10 Å and 100 Å, are left to protect the substrate upper surface 318 during subsequent oxidation processes. In some embodiments, the etch comprises an isotropic etch (e.g., a dry plasma etch) directed perpendicular to the substrate upper surface 318.

In FIG. 3F, a first photoresist layer 326 has been spin-coated over the over the substrate upper surface 318. The semiconductor substrate 102 has then been exposed to radiation (e.g., light), and developed to form a first opening 328 between the first and second gate stacks 302A, 302B. For the embodiments of FIG. 3F, an etch process has been performed through the first opening 328, to the substrate upper surface 318 to remove horizontal portion 346B of the gap oxide layer 322. The semiconductor substrate 102 has then been implanted with dopants 330 through the first opening 328 to form a shared common source region 106. In some embodiments, the dopants 330 include acceptors such as boron (B), aluminum (Al), gallium (Ga), indium (In), etc., which forms a p-type shared common source region 106. In other embodiments, the dopants 330 include donors such as nitrogen (N), phosphorous (P), arsenic (As), antimony (Sb), or bismuth (Bi), etc., which forms an n-type shared common source region 106.

In FIG. 3G, the first photoresist layer 326 has been removed, using conventional techniques, such as stripping, ashing, or the like. An anneal has also been performed to drive in and activate the implanted dopants 330, which increases a width 332A, 332B and a depth 334A, 334B of the shared common source region 106.

In FIG. 3H, a bottom antireflective coating (BARC) 336 has been formed on the substrate upper surface 318 through a spin-coating or other appropriate technique. The BARC 336 is configured to protect the substrate upper surface 318 during a subsequently-performed etch.

In FIG. 3I, source-facing floating gate sidewalls 140 of the floating gates 110 have been etched to form concave surfaces, which taper down towards a neck region 144 within the floating gate 110. The etch is an isotropic selective etch, which utilizes an dry etchant (not shown) with an etch selectivity between the Si of the floating gates 110 and the dielectric material (e.g., oxide) of the first gate dielectric 114, the gap oxide 134, the first dielectric layer 168, the second dielectric layer 172, and the first spacer dielectric layer 166. As a result, the dry etchant etches the Si at a substantially higher rate than the dielectric material. The dry etchant has a similar etch selectivity between the Si of the floating gates 110 and the nitride material of the first nitride layer 170, the second nitride layer 316, and the spacer nitride layer 164. As a result, the dry etchant etches the Si at a substantially higher rate than the nitride material. Therefore, because the BARC 336 covers the substrate upper surface 318, only the source-facing floating gate sidewalls 140 of the floating gates 110 are substantially etched. Moreover, because the gap oxide 134 covers the drain-facing floating gate sidewalls 148, they are not etched, and therefore form substantially planar vertical surfaces. As a result of the different contours between the source-facing floating gate sidewalls 140 and the drain-facing floating gate sidewalls 148, the floating gates 110 have an asymmetric shape.

In some embodiments, the isotropic selective etch is a cyclic deposition etch (CDE), during which the semiconductor substrate 102 is exposed to periodic pulses of one or more vapor etchants such as hydrogen chloride (HCl) configured to selectively etch away Si, while leaving oxide and nitride substantially intact. In some embodiments, the CDE uses a plasma etchant source within a processing chamber (e.g., an ultra high vacuum chamber), where the CDE conditions are tuned to minimize damage to the oxide and nitride. The CDE conditions include: a pressure within the processing chamber, a frequency of a plasma etchant source, a composition of the plasma etchant, a flow rate of the plasma etchant, etc. Note a high aspect ratio between a height 342 and a width 344 of the second nitride layer 316 along source-facing sidewalls 340 of the first and second gate stacks 302A, 302B.

In FIG. 3J, the second nitride layer 316 has been removed from source-facing sidewalls 340 of the first and second gate stacks 302A, 302B. In some embodiments, the second nitride layer 316 is removed by a wet etchant (not shown), having an etch selectivity that is different than that of the dry etchant. The wet etchant is configured to selectively remove nitride at a higher rate than oxide, and at substantially higher rate than Si. Consequently, the exposed nitride of the second nitride layer 316 arranged along the source-facing floating gate sidewalls 140 of the first and second gate stacks 302A, 302B is etched completely away. Removal of the second nitride layer 316 without significant removal of the surrounding layers is achieved because of the high aspect ratio of the second nitride layer 316. The wet etchant reacts with the nitride material on a vertical source-facing surface of the second nitride layer 316, etching through the width 344 of the second nitride layer 316. The dielectric of the first spacer dielectric layer 166 resists the horizontally moving wet etchant, causing it to "fall down" vertically along the source-facing sidewalls 340, where it accumulates directly over the second dielectric layer 172 of the ONO layer 120. Although the second dielectric layer 172 is also resistive to the wet etchant, a high concentration of the accumulated wet etchant causes the second dielectric layer 172, and the first dielectric layer 168, to be etched substantially faster than other nitride regions of the first and second gate stacks 302A, 302B. Removal of the portions of the ONO layer 120 that are directly beneath the second nitride layer 316 exposes the floating gate upper surfaces 130, thereby forming a floating gate ledges 142. In some embodiments, the wet etchant includes a mixture of ethylene glycol and hydrofluoric acid (HF).

In FIG. 3K, a field dielectric 158 has then been formed over the shared common source region 106. In some embodiments, the field dielectric 158 has been formed through a wet oxidation, wherein the substrate upper surface 318 has been exposed to a source vapor of water and oxide, which consumes Si of the semiconductor substrate 102 to form the field dielectric 158, which comprises $SiO_2$. The field dielectric 158 electrically isolates the shared common source region 106 beneath it. Thin horizontal portions 346A and 346C of the gap oxide layer 322 protect regions of the substrate upper surface 318 from being oxidized, as they cover regions of the substrate upper surface 318 other than the shared common source region 106, and thus prevent consumption of the Si in those regions.

In FIG. 3L, a tunnel dielectric layer 338 has then been formed over the substrate upper surface 318, and over and along sidewalls of the first and second gate dioxide ($SiO_2$) formed through PVD, CVD, ALD, MBE, e-beam epitaxy, or other appropriate process. In some embodiments, the tunnel dielectric layer 338 has a uniform thickness. A horizontal surface 350 of the tunneling dielectric layer 338 is arranged over the floating gate upper surface 130. The horizontal surface 350 forms a tunneling dielectric ledge 150 that is arranged over the floating gate ledge 142. Note that the thin horizontal portions 346A and 346C of the gap oxide layer 322 remain over the portions of the substrate upper surface 318 beneath the tunnel dielectric layer 338.

In FIG. 3M, a second photoresist layer 352 has been spin-coated over the over the substrate upper surface 318. The semiconductor substrate 102 has then been exposed to radiation, and developed to form openings 354 over drain regions of the memory device 100.

In FIG. 3N, portions of the tunnel dielectric layer 338 not covered by the second photoresist layer 352, and the thin horizontal portions 346A and 346C of the gap oxide layer 322, have been removed through an oxide strip or etch process. The second photoresist layer 352 has been removed, using conventional techniques, such as stripping, ashing, or the like. Remaining portions of the tunneling dielectric layer 338 form a tunneling path between the floating gate 110 and an erase gate (124) subsequently formed over the shared common source region 106.

In FIG. 3O, third dielectrics 152 have been formed over the substrate upper surface through photolithography. An erase gate 124 have then been formed between the first and second gate stacks 302A, 302B over the shared common source region 106. Memory gates 132 have also been formed over the third dielectrics 152. In some embodiments, the erase gate 124 and memory gate 132 are formed from polysilicon through a single deposition step using PVD, CVD, ALD, MBE, e-beam epitaxy, or other appropriate process. A memory gate spacer layer 356 is then formed over the memory device 100 through PVD, CVD, ALD, MBE, e-beam epitaxy, or other appropriate process. In some embodiments, the memory gate spacer layer 356 is conformal to its underlying features. In some embodiments, the memory gate spacer layer 356 has a substantially uniform thickness.

In FIG. 3P, an etch has been performed to remove horizontal portions of the memory gate spacer layer 356 from over the substrate upper surface 318. The etch leaves a vertical portion of the memory gate spacer layer 356 along drain-facing memory gate sidewalls 156, which form the memory gate spacer 154. The semiconductor substrate 102 has then been implanted with dopants (e.g., B, Al, Ga, In, for p-type; or P, As, Sb, or Bi for n-type) through the substrate upper surface 318 to form individual drain regions 108. The dopants have then been driven into the semiconductor substrate 102 activated by an anneal, or other appropriate process, An upper gate surface 358 of the memory device 100 has then been planarized through a chemical mechanical polish (CMP), or other appropriate process. After the CMP process, remaining portions of the second nitride layer 316 form the vertical nitride layer 136, which isolates the drain-facing sidewall spacer 122B from the gap oxide 134

Operation of the memory device 100 of FIG. 3P is now described. For the purpose of illustration, exemplary voltage ranges are given in the following description. These voltage ranges are intended to add clarity to the description, and are not intended to be limiting.

Independent biasing of the control gates 116, the memory gates 132, and the shared erase gate 124 allows for writing, reading, and erasing data from the memory device 100. For example, in a write mode of operation of the memory cell 104A, a memory gate voltage ($V_{MG}$) (e.g., +1.0 V), which is greater than a threshold voltage ($V_t$) of the memory device 100 applied to memory gate 132 by voltages source 360A. The $V_{MG}$ forms an inversion layer within a channel region 112 of the memory cell 104A, in which electrons move between the common source region 106 and the individual drain region 108 of the memory cell 104A. A control gate voltage ($V_{CG}$), which is also greater than the $V_t$ is applied to the control gate 116 by voltage source 360B. The $V_{CG}$ applied to the control gate 116 by voltage source 360B is large enough (e.g., +11.0 V) to promote tunneling of the electron from the channel region 112, though the first gate dielectric 114, and into the floating gate 110 by hot-electron injection at the source side of the floating gate 110. The electrons are consequently stored within the floating gate 110 indefinitely. An erase gate voltage ($V_{EG}$) (e.g., +5.0 V) is also applied to the erase gate 124 in the write mode of operation.

The charge resulting from the stored electrons with the floating gate 110 screens an electric field formed between the control gate 116 and the channel region 112 when the control gate 116 is biased by voltage source 360B. This has an effect of increasing the $V_t$ of memory cell 104A by an amount $\Delta V_t$ that is proportional to the thickness of the first gate dielectric 114. In a read mode of operation of the memory cell 104A, a $V_{MG}$ (e.g., +3.0 V) that is greater than the $V_t$ is applied to memory gate 132 by voltages source 360A. The $V_{MG}$ applied in read mode is greater than the $V_{MG}$ applied in write mode to insure robust inversion within the channel region 112 beneath the memory gate 132. In the read mode of operation, the threshold voltage increase $\Delta V_t$ can be used to sense stored charge within the memory cell 104A. By applying a $V_{CG}$ to the control gate 116 from voltage source 360B that is greater than $V_t$, but less than $V_t+\Delta V_t$ (e.g., +2.0 V), an inversion layer is only formed below the floating gate 110 if no electric charge is stored. If the floating gate 110 stores electric charge, then the electric field from the control gate 116 is screened by the floating gate 110, and no inversion layer (or a weak inversion layer) is formed, which does not allow electrons to move between the common source region 106 and the individual drain region 108 of the memory cell 104A. In this manner, the stored state within the memory cell 104A can be sensed. If the memory cell 104A turns on, then it stores a first data state (e.g., a logical "0"). If the memory cell 104A does not turn on, then it stores a second data state (e.g., a logical "1"). A $V_{EG}$=0 V is also applied to the erase gate 124 in the read mode of operation.

In an erase mode of operation of the memory cell 104A, a voltage ($V_{EG}$) (e.g., +13.0 V) is applied to the erase gate 124 by voltage source 360C, while VCG and VMG are both held at 0 V. The $V_{EG}$ creates a lateral electric field, which allows the electrons to tunnel from the floating gate 110, through the tunneling dielectric 138, and into the erase gate 124 through Fowler-Nordheim tunneling. The floating gate ledge 142 (and the tunneling dielectric ledge 150 that is formed by the conformal tunneling dielectric 138) provides a faster path for tunneling of the electrons through the tunneling dielectric 138 compared to a floating gate with a planar sidewall surface. The floating gate ledge 142 (and the tunneling dielectric ledge 150 that is formed by the conformal tunneling dielectric 138) consequently improves the erase speed of the memory device 100 over some conventional memory devices with planar floating gate sidewalls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Therefore, some embodiments of the present disclosure relate to a FLASH memory device. The FLASH memory device improves erase speed over some conventional memory devices through an asymmetric floating gate geometry. A control gate is arranged over a floating gate. An erase gate is arranged laterally adjacent the floating gate, and is separated from the floating gate by a tunneling dielectric layer. A sidewall spacer is arranged along a vertical sidewall of the control gate, and over an upper surface of the floating gate, between the control gate and the tunneling dielectric layer. A portion of the floating gate upper surface forms a "ledge," or a sharp corner, which extends horizontally past the sidewall spacer, pointing into the tunneling dielectric layer. A sidewall of the floating gate forms a concave surface, which tapers down from the ledge towards a neck region within the floating gate. The ledge provides a faster path for tunneling of the electrons through the tunneling dielectric layer compared to a floating gate with a planar sidewall surface. The ledge consequently improves the erase speed of the FLASH memory device over some conventional memory devices with planar floating gate sidewalls.

Some embodiments relate to a memory device. The memory device comprises a semiconductor substrate comprising a source region and drain region, which are laterally separated from one another by a channel region. A floating gate is arranged over the channel region. A first gate dielectric separates the floating gate from the channel region. A control gate is arranged over the floating gate. A second gate dielectric separates the control gate from the floating gate. An erase gate is arranged adjacent the control and floating gates, and over the source region. A source-facing sidewall spacer is arranged between the control and erase gates along a source-facing sidewall of the control gate, and over a floating gate upper surface. The floating gate upper surface extends horizontally past the source-facing sidewall spacer to form a floating gate ledge adjacent the erase gate.

Other embodiments relate to an integrated circuit containing a memory device. The memory device comprises a semiconductor substrate comprising a source region and drain region, which are laterally separated from one another by a channel region. A gate stack is arranged over the channel region. The gate stack comprise a floating gate arranged over the channel region. A first gate dielectric separates the floating gate from the channel region. The gate stack further comprises a control gate arranged over the floating gate. A second gate dielectric separates the control gate from the floating gate. The control gate is narrower than the floating gate. The gate stack also comprises source-facing sidewall spacer and a drain-facing sidewall spacer, which are formed along opposite vertical sidewalls of the control gate and over a floating gate upper surface. The floating gate upper surface extends horizontally past the source-facing sidewall spacer, thereby forming a floating gate ledge adjacent the source region.

Still other embodiments relate to a method of forming a memory device. A floating gate is formed over a channel region of a substrate, wherein the channel region laterally separates a source region of the substrate from a drain region of the substrate. A control gate is formed over the floating gate. The control gate narrower than the floating gate, such that a floating gate upper surface extends horizontally past vertical sidewalls of the control gate. A source-facing sidewall spacer and a drain-facing sidewall spacer are formed along the vertical sidewalls of the control gate. The source-facing sidewall spacer and the drain-facing sidewall spacer are vertically aligned with vertical sidewalls of the floating gate. A first etching process is performed to a source-facing vertical sidewall of the floating gate to remove floating gate material, which forms a concave surface within the source-facing vertical sidewall of the floating gate.

What is claimed is:

1. A memory device, comprising:
a semiconductor substrate comprising a source region and drain region, which are laterally separated from one another by a channel region;
a floating gate arranged over the channel region, wherein a first gate dielectric separates the floating gate from the channel region;
a control gate arranged over the floating gate, wherein an oxide-nitride-oxide (ONO) dielectric structure is arranged under the control gate to separate the control gate from the floating gate and wherein the ONO dielectric structure extends outwardly beyond a source-facing sidewall of the control gate;
an erase gate arranged adjacent the control and floating gates, and over the source region; and
a source-facing sidewall spacer arranged between the control and erase gates along a source-facing sidewall of the control gate, and arranged directly over an upper surface of the ONO dielectric structure, wherein the floating gate upper surface extends horizontally past the source-facing sidewall spacer to form a floating gate ledge adjacent the erase gate.

2. The memory device of claim 1, wherein the floating gate ledge extends along a length of the source-facing sidewall of the control gate.

3. The memory device of claim 1, wherein the floating gate has an asymmetric shape about a vertical axis that bisects the floating gate upper surface.

4. The memory device of claim 3,
wherein a drain-facing floating gate sidewall forms a substantially planar vertical surface; and
wherein a source-facing floating gate sidewall forms a concave surface, which tapers down from the floating gate ledge towards a neck region within the floating gate, wherein the neck region is narrower than the floating gate upper surface.

5. The memory device of claim 4, wherein the neck region has a width that is less than a bottom width of the floating gate at a bottom surface of the floating gate.

6. The memory device of claim 1, further comprising:
a tunneling dielectric layer that extends along a source-facing floating gate sidewall to separate the erase gate from the floating gate;
wherein a horizontal surface of the tunneling dielectric layer arranged over the floating gate upper surface forms a tunneling dielectric ledge which is arranged over the floating gate ledge and which is at a vertical position over the substrate corresponding to a height within the ONO dielectric structure.

7. The memory device of claim 6, wherein the tunneling dielectric layer has a uniform thickness between the erase gate and the floating gate.

8. The memory device of claim 1, further comprising a drain-facing sidewall spacer arranged along a drain-facing sidewall of the control gate and over the floating gate upper surface, the drain-facing sidewall spacer comprising:
a first spacer dielectric layer comprising a first horizontal portion that extends over the floating gate upper surface, and a first vertical portion that extends along the drain-facing sidewall of the control gate;
a spacer nitride layer comprising a second horizontal portion that extends over the first horizontal portion of the first spacer dielectric layer, and a second vertical portion that extends along the first vertical portion of the first spacer dielectric layer; and
a second spacer dielectric layer arranged over the second horizontal portion of the spacer nitride layer that extends along the second vertical portion of the spacer nitride layer.

9. The memory device of claim 8, further comprising:
a memory gate arranged over the channel region;
a gap oxide that isolates the drain-facing sidewall spacer from the memory gate; and
a vertical nitride layer that isolates the drain-facing sidewall spacer from the gap oxide.

10. An integrated circuit containing a memory device, the memory device comprising:
a semiconductor substrate comprising a source region and drain region, which are laterally separated from one another by a channel region;
a gate stack arranged over the channel region, the gate stack comprising:
a floating gate arranged over the channel region, wherein a first gate dielectric separates the floating gate from the channel region; and
a control gate arranged over the floating gate, wherein a second gate dielectric separates the control gate from the floating gate, and wherein the control gate is narrower than the floating gate; and
a source-facing sidewall spacer and a drain-facing sidewall spacer, which are formed along opposite vertical sidewalls of the control gate and over a floating gate upper surface, wherein the floating gate upper surface extends horizontally past the source-facing sidewall spacer, thereby forming a floating gate ledge adjacent the source region;
a gap oxide arranged vertically along the drain-facing sidewall spacer;
a memory gate arranged over the channel region, and separated from the gate stack by the gap oxide; and a vertical nitride layer that isolates the drain-facing sidewall spacer from the gap oxide.

11. The integrated circuit of claim 10, wherein a source-facing floating gate sidewall forms a concave surface, which tapers down from the floating gate ledge towards a neck region within the floating gate, wherein the neck region has a width that is less than a bottom width of the floating gate at a bottom surface of the floating gate.

12. The integrated circuit of claim 10, further comprising:
a tunneling dielectric layer that extends along the source-facing sidewall spacer of the floating gate;
wherein a horizontal surface of the tunneling dielectric layer arranged over the floating gate upper surface forms a tunneling dielectric ledge arranged over the floating gate ledge.

13. The integrated circuit of claim 12, further comprising an erase gate arranged over the source region, wherein the erase gate is separated from the gate stack by the tunneling dielectric layer.

14. The integrated circuit of claim 10, further comprising a second memory device, which is a mirror image of the memory device, and which shares the source region with the memory device.

15. A memory device, comprising:
a semiconductor substrate comprising a source region and drain region, which are laterally separated from one another by a channel region;
a floating gate arranged over the channel region, wherein a first gate dielectric separates the floating gate from the channel region;
a control gate arranged over the floating gate, wherein a second gate dielectric separates the control gate from the floating gate;
an erase gate arranged adjacent the control and floating gates, and over the source region;
a source-facing sidewall spacer arranged between the control and erase gates along a source-facing sidewall of the control gate;
a drain-facing sidewall spacer that laterally contacts the control gate along a drain-facing sidewall of the control gate, wherein the drain-facing sidewall spacer is arranged over an upper surface of the floating gate; and
a vertical nitride layer arranged over an upper surface of the floating gate and is spaced apart from the drain-facing sidewall by the drain-facing sidewall spacer.

16. The memory device of claim 15, further comprising:
a source-facing sidewall spacer arranged between the control and erase gates along a source-facing sidewall of the control gate, and over the upper surface of the floating gate, wherein the upper surface of the floating gate extends horizontally past the source-facing sidewall spacer to form a floating gate ledge adjacent the erase gate.

17. The memory device of claim 16, wherein the floating gate ledge extends along a length of the source-facing sidewall of the control gate.

18. The memory device of claim 15, wherein the floating gate has an asymmetric shape about a vertical axis that bisects the floating gate upper surface.

19. The memory device of claim 1, further comprising:
a second gate dielectric arranged over the ONO dielectric structure and separating the ONO dielectric structure from the control gate, the second gate dielectric having outer sidewalls aligned to outer sidewalls of the control gate.

* * * * *